(12) United States Patent
Spessot et al.

(10) Patent No.: US 9,531,371 B2
(45) Date of Patent: Dec. 27, 2016

(54) RESTORING OFF-STATE STRESS DEGRADATION OF THRESHOLD VOLTAGE

(71) Applicant: IMEC VZW, Leuven (BE)

(72) Inventors: Alessio Spessot, Gradisxa D'isonzo (IT); Moon Ju Cho, Wavre (BE)

(73) Assignee: IMEC VZW, Leuven (BE)

( * ) Notice: Subject to any disclaimer, the term of this patent is extended or adjusted under 35 U.S.C. 154(b) by 0 days.

(21) Appl. No.: 14/570,592

(22) Filed: Dec. 15, 2014

(65) Prior Publication Data
US 2015/0171857 A1    Jun. 18, 2015

(30) Foreign Application Priority Data
Dec. 13, 2013   (EP) ..................................... 13197303

(51) Int. Cl.
| | | |
|---|---|---|
| H03K 3/011 | (2006.01) | |
| H03K 17/16 | (2006.01) | |
| H03K 17/14 | (2006.01) | |
| H03K 17/687 | (2006.01) | |
| G01R 31/26 | (2014.01) | |

(52) U.S. Cl.
CPC ......... H03K 17/165 (2013.01); G01R 31/2621 (2013.01); H03K 3/011 (2013.01); H03K 17/145 (2013.01); H03K 17/687 (2013.01)

(58) Field of Classification Search
CPC .. H03K 17/165; H03K 17/145; H03K 17/687; H03K 3/011; G01R 31/2621
See application file for complete search history.

(56) References Cited

U.S. PATENT DOCUMENTS

| | | | | |
|---|---|---|---|---|
| 3,806,741 A | * | 4/1974 | Smith | ..................... G05F 3/205 327/537 |
| 4,142,114 A | | 2/1979 | Green | |
| 4,791,318 A | * | 12/1988 | Lewis | ............. H03K 19/00384 327/537 |
| 4,794,278 A | * | 12/1988 | Vajdic | ..................... G05F 3/205 327/309 |
| 5,874,851 A | * | 2/1999 | Shiota | ..................... G05F 3/247 257/E27.06 |
| 7,453,311 B1 | | 11/2008 | Hart et al. | |
| 7,961,034 B2 | | 6/2011 | Konstadinidis | |

(Continued)

OTHER PUBLICATIONS

Li, Lin et al., "Proactive Recovery for BTI in High-k SRAM Cells", Design, Automation & Test in Europe Conference & Exhibition, Mar. 14-18, 2011, pp. 1-6.

(Continued)

*Primary Examiner* — Jung Kim
(74) *Attorney, Agent, or Firm* — McDonnell Boehnen Hulbert & Berghoff LLP

(57) ABSTRACT

A method for at least partially compensating for a change in threshold voltage level of a FET transistor induced by OFF-state stress degradation includes determining a signal indicative of a change in threshold voltage level of the FET with respect to a reference threshold voltage level, and applying a restoration signal to the FET. This restoration signal is adapted for shifting the threshold voltage level of the FET in a direction having opposite sign with respect to the change in threshold voltage level. Applying the restoration signal further includes taking into account the signal indicative of the change in threshold voltage level.

15 Claims, 10 Drawing Sheets

(56) References Cited

U.S. PATENT DOCUMENTS

| | | | |
|---|---|---|---|
| 8,098,536 | B2 | 1/2012 | Hsu et al. |
| 8,290,759 | B1 | 10/2012 | Mu et al. |
| 2012/0216067 | A1 | 8/2012 | Whatmough et al. |
| 2012/0274384 | A1 | 11/2012 | Gan et al. |
| 2013/0223172 | A1 | 8/2013 | Hsu et al. |

OTHER PUBLICATIONS

Lee, Nam-Hyun et al. "Effect of OFF-State Stress and Drain Relaxation Voltage on Degradation of a Nanoscale nMOSFET at High Temperature", IEEE Electron Device Letters, vol. 32, No. 7, Jul. 2011, pp. 856-858.

Lo, Wen-Hung et al., "Abnormal Interface State Generation Under Positive Bias Stress in TiN/HfO2 p-Channel Metal-Oxide-Semiconductor Field Effect Transistors", Applied Physics Letters, vol. 101, No. 13, Sep. 24, 2012, pp. 133505-1-133505-4.

European Search Report, European Patent Application 13197303.4, dated Aug. 28, 2014.

* cited by examiner

RESTORING OFF-STATE STRESS DEGRADATION OF THRESHOLD VOLTAGE

CROSS-REFERENCE TO RELATED APPLICATION

This application claims priority to European Patent Application No. 13197303.4 filed on Dec. 13, 2013, the contents of which are hereby incorporated by reference.

FIELD OF THE DISCLOSURE

This disclosure relates to the field of integrated semiconductor technology. More specifically it relates to a method and device for restoring the threshold voltage level of a field-effect transistor affected by OFF-state stress degradation.

BACKGROUND OF THE DISCLOSURE

The threshold voltage $V_{th}$ of a field-effect transistor (FET) is the minimal value of gate-source voltage for which a current can flow via a conducting channel connecting the transistor's source and drain terminals. While for wide planar transistors the threshold voltage is a well-defined characteristic substantially independent of the drain-source voltage, in modern ultra-scale FETs, e.g. nanometer-sized metal-oxide semiconductor field-effect transistors (MOSFET), the threshold voltage is not as stable, for example due to drain-induced barrier lowering.

In ultra-scaled devices, such as high-end memory modules, system-on-chip (SoC) devices or field-programmable gate arrays (FPGA), the OFF-state current $I_{OFF}$ may typically increase with the thinning of the gate oxide dielectric $T_{ox}$ and the reduction of the gate length $L_{gate}$. In fact, both Drain Induced Barrier Lowering (DIBL) and Gate Induced Drain Leakage (GIDL) may cause the electric field in the channel between the Source and Drain to increase. The electrons flowing into the nMOS may thus be accelerated by a stronger lateral electric field, which induces higher impact ionization and may cause related reliability problems.

In a standard complementary metal-oxide semiconductor (CMOS) inverter, the N-channel MOSFET transistor is stressed in different ways during its operating life. When the device is in the ON-state, e.g. gate and drain voltages tied to the supply voltage: $V_g = V_d = V_{dd}$, it is subject to hot carrier injection (HCI), e.g. channel hot electron (CHE) injection. When the device is biased with a high drain voltage $V_d$ while the gate voltage $V_g = 0$ V, and source and body are polarized at ground, OFF-State Stress (OSS) can occur. This Off-State Stress, also known as Non Conductive Stress (NCS), is a degradation phenomenon occurring in both NMOS and PMOS. While HCI degradation occurring in the ON-state is an extensively studied phenomenon, the OSS degradation occurring in the OFF-state has received little attention in the past, since it may have been considered to convey less risk than degradation in the ON-state.

The OSS degradation phenomenon has been studied for poly-SiO$_2$ technology, but although the OSS effect was measurable, it was found not to represent a significant source of degradation, e.g. the threshold voltage $V_{th}$ shift induced by nMOS OFF-State Stress degradation may be substantially smaller than the $V_{th}$ shift induced by pMOS negative-bias temperature instability (NBTI). For example, the OSS degradation mechanism and the drain relaxation behaviour of nMOS in advanced technology nodes, down to 65 nm, has been described by Lee et al. in "Effect of OFF-State Stress and Drain Relaxation Voltage on Degradation of a Nanoscale nMOSFET at High Temperature", IEEE Electron Device Letters 32(7), p. 856.

SUMMARY OF THE DISCLOSURE

The OSS may not have been previously analyzed in detail for high-κ metal gate (HKMG) technology. Surprisingly, experiments and theoretical considerations detailed hereinbelow may reveal that the OSS qualitatively and quantitatively differs in HKMG FETs as compared to standard silicon oxide FETs. In particular, it is observed that where the OSS degradation may be small or even negligible compared to other degradation effects in conventional poly-silicon gate technology, the OSS effect in high-κ metal gate FETs can form a substantial source of degradation. Although this problem may not have been previously recognized in the art, OSS degradation could become a critical issue for implementing HKMG technology in high volume manufacturing of, for example, DRAM modules, field-programmable gate arrays (FPGA), System-on-Chip devices (SoC), and flash memory modules like NAND or NOR.

It is therefore an object of embodiments of the present disclosure to provide methods and means for remediating the detrimental impact of OFF-state stress in field-effect transistor devices.

The above objective is accomplished by a method and device according to embodiments of the present disclosure.

In a first aspect, the present disclosure provides a method for at least partially compensating for a change in threshold voltage level of a field-effect transistor induced by OFF-state stress degradation. The method includes determining a signal indicative of a change in threshold voltage level of the field-effect transistor with respect to a reference threshold voltage level, and applying a restoration signal to the field-effect transistor. The restoration signal may be adapted for shifting the threshold voltage level of the field-effect transistor in a direction having an opposite sign with respect to the change in threshold voltage level. Further, applying the restoration signal may include taking the signal indicative of the change in threshold voltage level into account.

In a method according to embodiments of the present disclosure, determining the signal indicative of the change in threshold voltage level may comprise determining a Boolean indicator value for indicating whether the threshold voltage has shifted in the negative direction by at least a predetermined amount with respect to the reference threshold voltage level. Further, applying the restoration signal may take into account the signal indicative of the change in threshold voltage level by applying the restoration signal if the Boolean indicator value is equal to true.

In a method according to embodiments of the present disclosure, determining the signal indicative of the change in threshold voltage level and applying the restoration signal to the field-effect transistor may be repeated until the signal indicative of the change in threshold voltage level indicates the change in threshold voltage level to be within a predetermined tolerance.

In embodiments of the present disclosure, applying the restoration signal may comprise applying at least one voltage pulse to the field-effect transistor such that a gate terminal of the field-effect transistor is connected to a higher voltage level than a drain terminal of the field-effect transistor and higher than a source terminal of the field-effect transistor. For example, the voltage between the gate terminal and the source terminal may be equal to the voltage between the gate terminal and the drain terminal of the field-effect transistor.

Applying the at least one voltage pulse may comprise applying the at least one voltage pulse to the field-effect transistor such that a voltage difference between the gate terminal and the drain terminal is larger than a voltage difference between the gate terminal and the source terminal. In embodiments of the present disclosure, applying the at least one voltage pulse to the field-effect transistor such that a voltage difference between the gate terminal and the drain terminal is larger than a voltage difference between the gate terminal and the source terminal may comprise calculating a source bias voltage and a drain bias voltage taking into account the signal indicative of the change in threshold voltage level of the field-effect transistor with respect to the reference threshold voltage level.

In a method according to embodiments of the present disclosure, applying the at least one voltage pulse may comprise applying the at least one voltage pulse of a predetermined duration and a predetermined positive voltage level to the gate terminal, while electrically grounding a body of the field-effect transistor, the source terminal and the drain terminal.

A method according to embodiments of the present disclosure may furthermore comprise automatically initiating the determining of the signal indicative of the change in threshold voltage level and applying the restoration signal when at least a predetermined number of operations were performed by the field-effect transistor since a previous determining of the signal indicative of the change in threshold voltage level.

In a method according to embodiments of the present disclosure, determining the signal indicative of the change in threshold voltage level with respect to the reference threshold voltage level may comprise determining the threshold voltage level as the threshold voltage level of a reference field-effect transistor.

In a second aspect, the present disclosure provides an integrated circuit component for at least partially compensating for a change in threshold voltage level of a field-effect transistor induced by OFF-state stress degradation, the integrated circuit component comprising a detection means for determining a signal indicative of a change in threshold voltage level of the field-effect transistor with respect to a reference threshold voltage level, and a signal generating means for applying a restoration signal to the field-effect transistor. The signal generating means is adapted for supplying a restoration signal to the field-effect transistor such that the threshold voltage level of the field-effect transistor is shifted in a direction having opposite sign with respect to the change in threshold voltage level, and in which the signal generating means is adapted for applying the restoration signal by taking the signal indicative of the change in threshold voltage level into account.

In a third aspect, the present disclosure provides an integrated semiconductor device comprising at least one field-effect transistor and an integrated circuit component according to embodiments of the second aspect for at least partially compensating for a change in threshold voltage level of the at least one field-effect transistor induced by OFF-state stress degradation.

In an integrated semiconductor device according to embodiments of the present disclosure, the at least one field-effect transistor comprises an n-channel and/or p-channel metal-oxide semiconductor field-effect transistor. In embodiments of the present disclosure, the field-effect transistor comprises a high-κ gate dielectric and a metal gate. The at least one field-effect transistor may comprise a gate stack having an electrical equivalent thickness (EOT) of 2.0 nm or less. The gate stack may comprise a SiO2/SiON layer having a thickness of 0.5 nm or more and a high-K dielectric layer having a thickness of 1 nm or more, e.g. the gate stack may comprise a SiO2/SiON layer having a thickness of 1 nm and a high-K dielectric layer having a thickness of 2 nm or more. The gate stack may comprise a SiO2/SiON layer having a thickness in the range of 2 nm to 15 nm, e.g. 5 nm to 15 nm, and a high-K dielectric layer having a thickness of 4 nm.

An integrated semiconductor device according to embodiments of the present disclosure may be a memory module, a field-programmable gate array or a system-on-chip device.

It is an advantage of embodiments of the present disclosure that a good stability and a long lifespan of transistor devices can be achieved.

It is an advantage of embodiments of the present disclosure that the detrimental effect of OFF-state stress in high-κ/metal gate (HKMG) field-effect transistors can be remediated.

Particular and preferred aspects of the disclosure are set out in the following description and accompanying independent and dependent claims. Features from the dependent claims may be combined with features of the independent claims and with features of other dependent claims as appropriate and not merely as explicitly set out in the claims.

These and other aspects of the disclosure will be apparent from and elucidated with reference to the embodiment(s) described hereinafter.

the region between source and drain. This carrier mobility change can be observed by measuring the gm or transconductance for local operating points.

Figure 12:
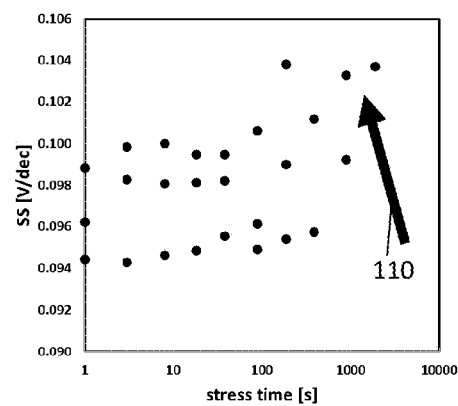

FIG. 12 shows the evolution of degradation vs. stress time for sub-threshold slope in a HKMG device for demonstrating principles of embodiments of the present disclosure.

Figure 13:
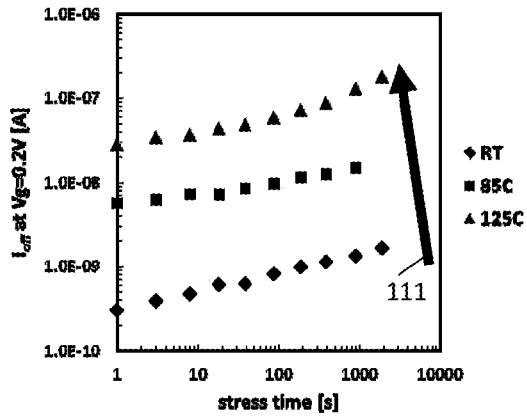

FIG. 13 shows the evolution of degradation vs. stress time for $I_{OFF}$ in a HKMG device for demonstrating principles of embodiments of the present disclosure.

Figure 14:
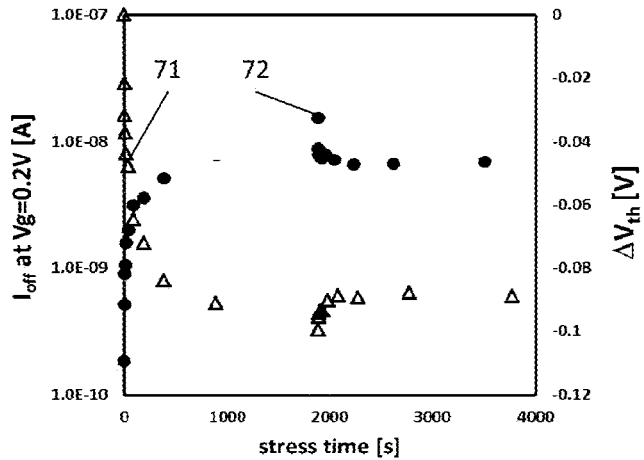

FIG. 14 shows the relaxation behaviour after stress at T=125° C. and VD=2.75V in a HKMG device for demonstrating principles of embodiments of the present disclosure.

Figure 15:
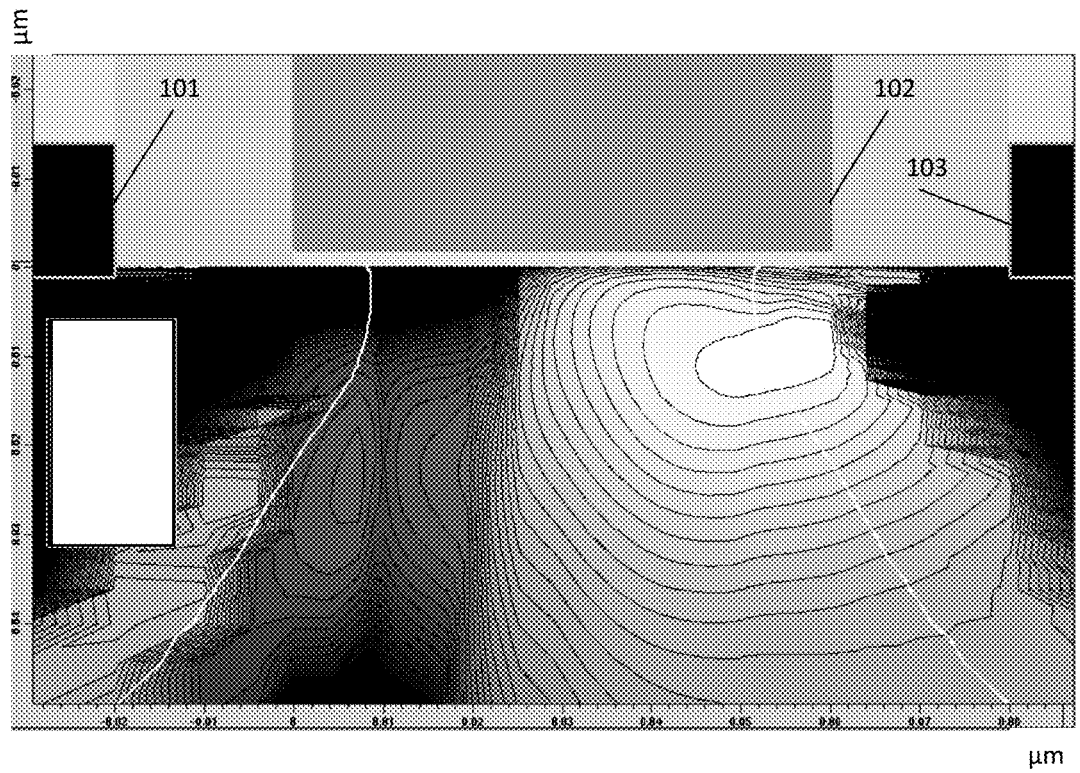

FIG. 15 shows a TCAD simulation of impact ionization current during OFF-state stress in a HKMG device for demonstrating principles of embodiments of the present disclosure.

Figure 16:
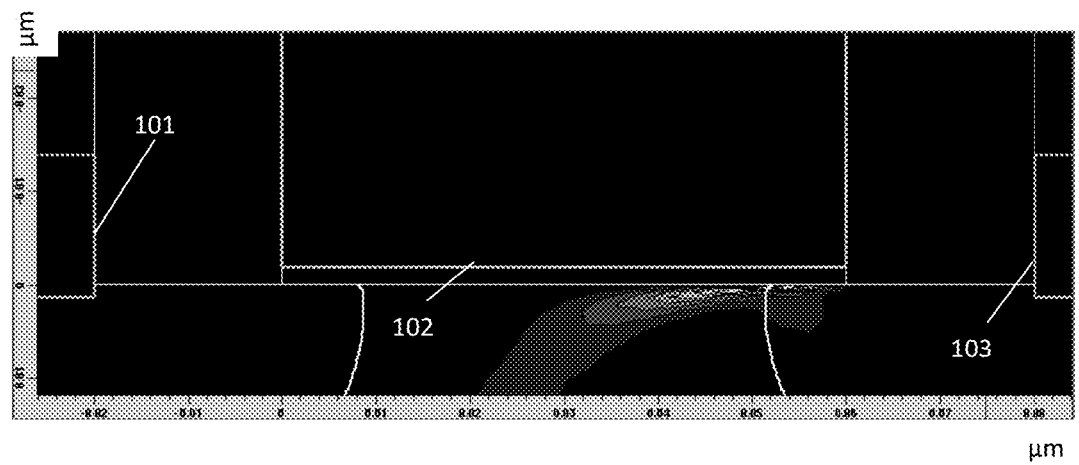

FIG. 16 shows a TCAD simulation of holes current during OFF-state stress in a HKMG device for demonstrating principles of embodiments of the present disclosure.

Figure 17:
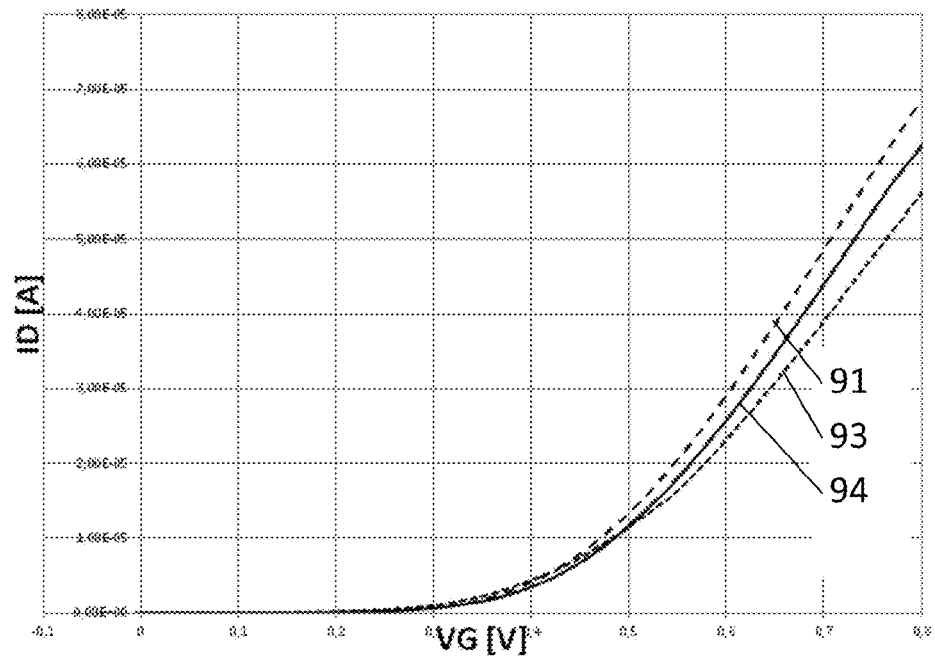

FIG. 17 shows the ID vs. VG curve of a NMOS HKMG FET for the initial condition, the stressed condition, and after $V_{th}$ correction in accordance with embodiments of the present disclosure.

Figure 18:
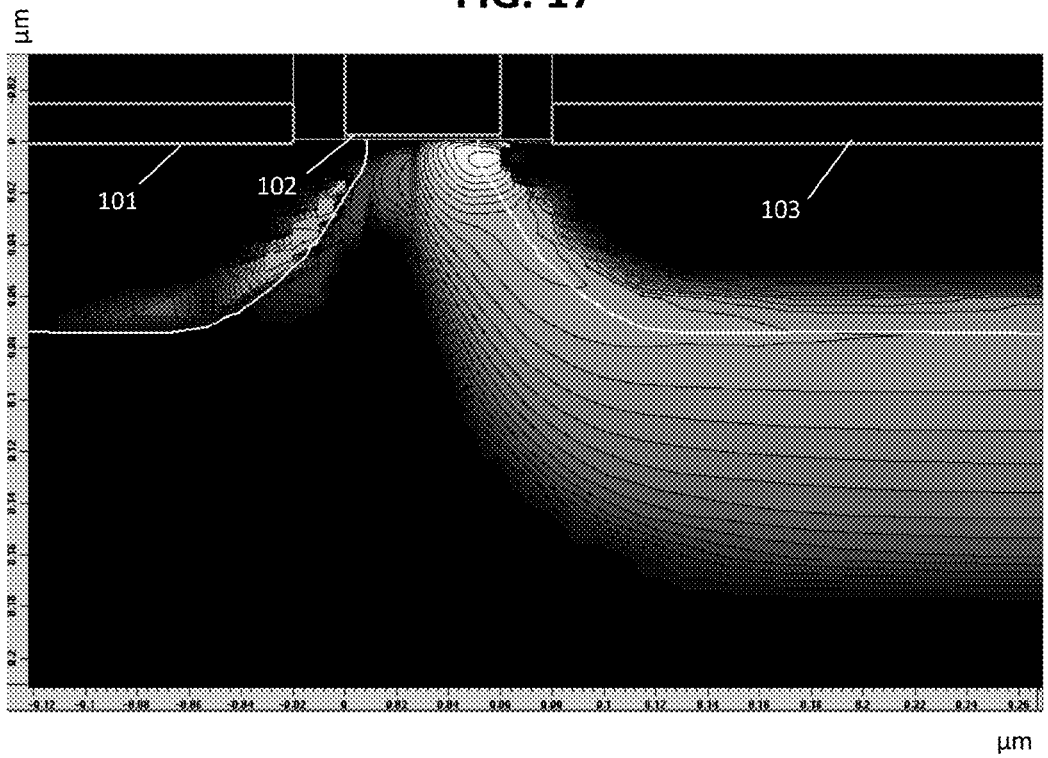

FIG. 18 illustrates a simulation of the impact ionization current in an NMOS HKMG FET device under a VD=1V OSS condition for demonstrating principles of embodiments of the present disclosure.

Figure 19:
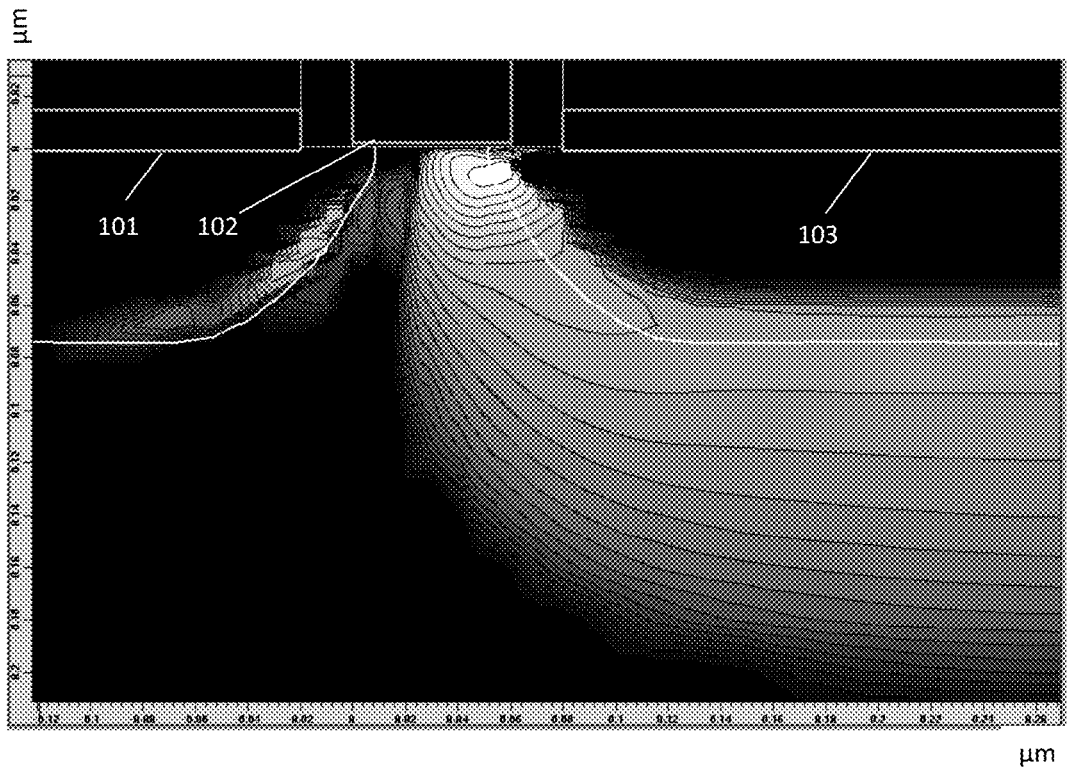

FIG. 19 illustrates a simulation of the impact ionization current in an NMOS HKMG FET under a VD=2V OSS condition for demonstrating principles of embodiments of the present disclosure.

Figure 20:
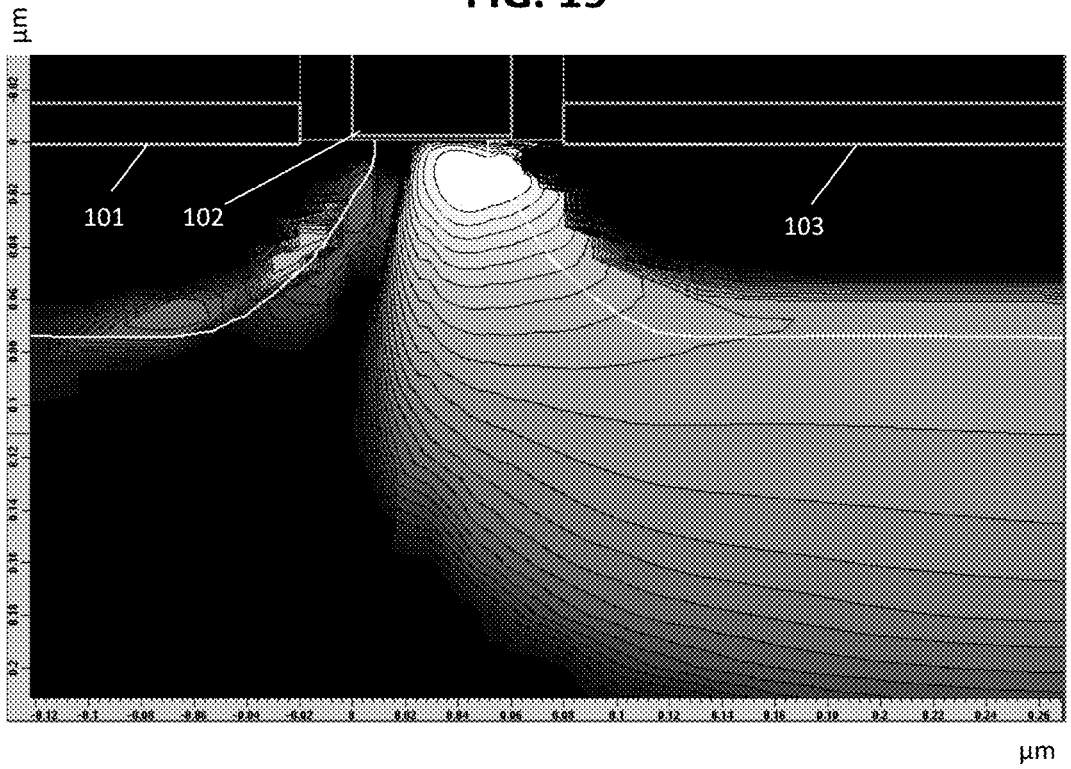

FIG. 20 illustrates a simulation of the impact ionization current in an NMOS HKMG FET under a VD=3V OSS condition for demonstrating principles of embodiments of the present disclosure.

Figure 21:
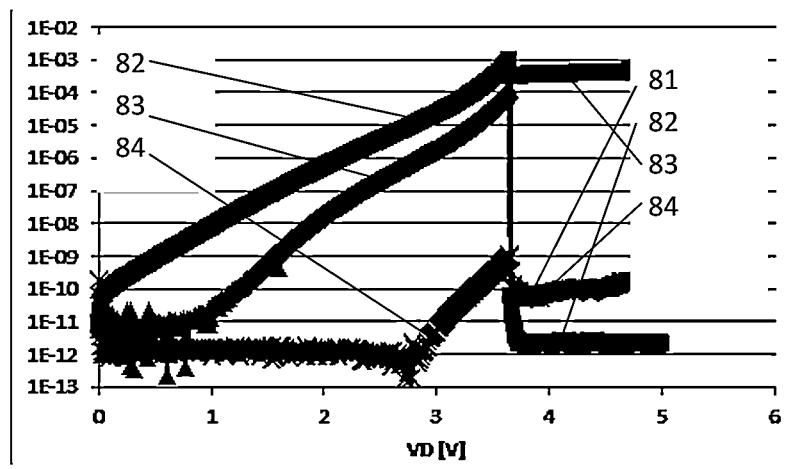

FIG. 21 shows the absolute values of the source current, drain current, gate current and bulk current versus the drain voltage for OSS under a grounded source condition for demonstrating principles of embodiments of the present disclosure.

Figure 22:
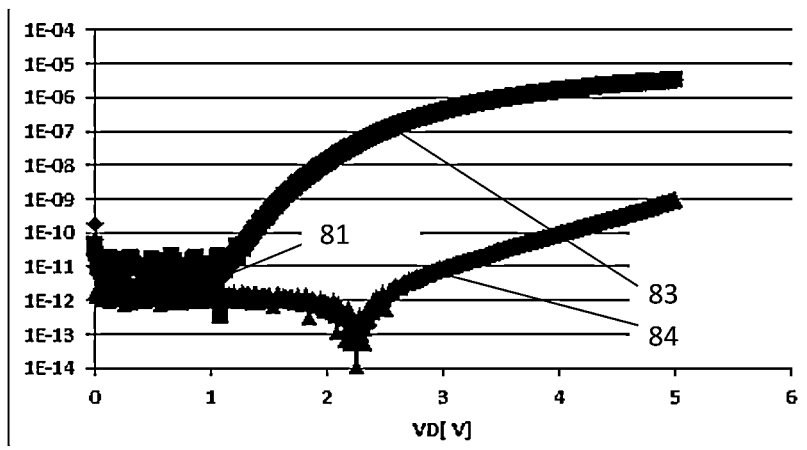

FIG. 22 shows the absolute values of the drain current, gate current and bulk current versus the drain voltage for OSS under a floating source condition for demonstrating principles of embodiments of the present disclosure.

The drawings are only schematic and are non-limiting. In the drawings, the size of some of the elements may be exaggerated and not drawn on scale for illustrative purposes.

In the different drawings, the same reference signs refer to the same or analogous elements.

DETAILED DESCRIPTION OF ILLUSTRATIVE EMBODIMENTS

The present disclosure will be described with respect to particular embodiments and with reference to certain drawings but the disclosure is not limited thereto but only by the claims. The drawings described are only schematic and are non-limiting. In the drawings, the size of some of the elements may be exaggerated and not drawn on scale for illustrative purposes. The dimensions and the relative dimensions may not correspond to actual reductions to practice of the disclosure.

The terms first, second and the like in the description and in the claims, are used for distinguishing between similar elements and not necessarily for describing a sequence, either temporally, spatially, in ranking or in any other manner. It is to be understood that the terms so used are interchangeable under appropriate circumstances and that the embodiments of the disclosure described herein are capable of operation in other sequences than described or illustrated herein.

Moreover, the terms top, bottom, over, under and the like in the description and the claims are used for descriptive purposes and not necessarily for describing relative positions. It is to be understood that the terms so used are interchangeable under appropriate circumstances and that the embodiments of the disclosure described herein are capable of operation in other orientations than described or illustrated herein.

It is to be noticed that the term "comprising", used in the claims, should not be interpreted as being restricted to the means listed thereafter; it does not exclude other elements or steps. It is thus to be interpreted as specifying the presence of the stated features, integers, steps or components as referred to, but does not preclude the presence or addition of one or more other features, integers, steps or components, or groups thereof. Thus, the scope of the expression "a device comprising means A and B" should not be limited to devices consisting only of components A and B. It means that with respect to the present disclosure, the only relevant components of the device are A and B.

Reference throughout this specification to "one embodiment" or "an embodiment" means that a particular feature, structure or characteristic described in connection with the embodiment is included in at least one embodiment of the present disclosure. Thus, appearances of the phrases "in one embodiment" or "in an embodiment" in various places throughout this specification are not necessarily all referring to the same embodiment, but may. Furthermore, the particular features, structures or characteristics may be combined in any suitable manner, as would be apparent to one of ordinary skill in the art from this disclosure, in one or more embodiments.

Similarly it should be appreciated that in the description of example embodiments of the disclosure, various features of the disclosure are sometimes grouped together in a single embodiment, figure, or description thereof for the purpose of streamlining the disclosure and aiding in the understanding of one or more of the various inventive aspects. This method of disclosure, however, is not to be interpreted as reflecting an intention that the claimed disclosure requires more features than are expressly recited in each claim. Rather, as the following claims reflect, inventive aspects may lie in less than all features of a single foregoing disclosed embodiment. Thus, the claims following the detailed description are hereby expressly incorporated into this detailed description, with each claim standing on its own as a separate embodiment of this disclosure.

Furthermore, while some embodiments described herein include some but not other features included in other embodiments, combinations of features of different embodiments are meant to be within the scope of the disclosure, and form different embodiments, as would be understood by those in the art. For example, in the following claims, any of the claimed embodiments can be used in any combination.

In the description provided herein, numerous specific details are set forth. However, it is understood that embodiments of the disclosure may be practiced without these specific details. In other instances, well-known methods, structures and techniques have not been shown in detail in order not to obscure an understanding of this description.

The OFF-state stress (OSS), which is also called Non Conductive Stress (NCS), is a degradation phenomenon occurring in both n-channel and p-channel metal-oxide semiconductor field-effect transistors (FETs). Although the OSS degradation phenomenon has been observed in FET structures comprising a poly-SiO$_2$ gate stack, the OSS does not represent a major source of degradation for these FET structures.

However, the experimental results presented further below show that in the case of a high-κ/Metal Gate (HKMG) FET, e.g. a field-effect transistor structure comprising a gate dielectric having a high dielectric constant κ and a metal gate, OSS can represent a significant factor of degradation. This may become an important problem when HKMG circuitry will be used in production in combination with, for example, a DRAM technology.

The OFF-state stress (OSS) is a phenomenon which is clearly different from both positive bias temperature instability (PBTI) and hot carrier injection (HCI). In an nMOS device, hot carrier injection of electrons occurs at high gate voltage and high drain voltage. This causes a positive threshold voltage shift, due to hot carrier injection over substantially the entire channel. On the other hand, PBTI occurs at high gate voltage, but substantially zero drain voltage. This causes a positive threshold voltage shift, and is caused by cold electrons. OSS occurs at substantially zero gate voltage and high drain voltage, and causes a negative threshold voltage shift. This may be caused by hot hole injection, which may occur non-uniformly over the channel. Particularly, it was observed that the defects caused by OSS in the channel are surprisingly more abundantly present closer to the drain, as will be further discussed hereinbelow.

Since particular devices will likely be degraded by the OSS under normal operating conditions, a possible remedy for this detrimental impact, e.g. to restore the functionality of the entire circuit, as provided by embodiments of the present disclosure may be particularly advantageous in the absence of a design solution to avoid this problem.

Embodiments of the present disclosure may provide a method and/or a circuit for at least partially restoring the functionality of a device after degradation by OFF-state stress (OSS). Particularly, a shift, e.g. a negative shift, of the threshold voltage $V_{th}$ associated with OSS degradation can be at least partially rebalanced, e.g. can be compensated for, in accordance with embodiments of the present disclosure.

The present disclosure relates in a first aspect to a method for at least partially compensating for a change in threshold voltage level of a field-effect transistor, e.g. particularly a high-κ metal gate field-effect transistor such as for instance a planar FET, a FinFET, or a vertical FET, induced by OFF-state stress degradation. This method comprises determining a signal indicative of a change in threshold voltage level of the field-effect transistor with respect to a reference threshold voltage level. The method further comprises applying a restoration signal to the field-effect transistor, in which this restoration signal is adapted for shifting the threshold voltage level of the field-effect transistor in a direction having opposite sign with respect to the change in threshold voltage level. This step of applying the restoration signal is furthermore taking into account the signal indicative of the change in threshold voltage level.

Figure 1:
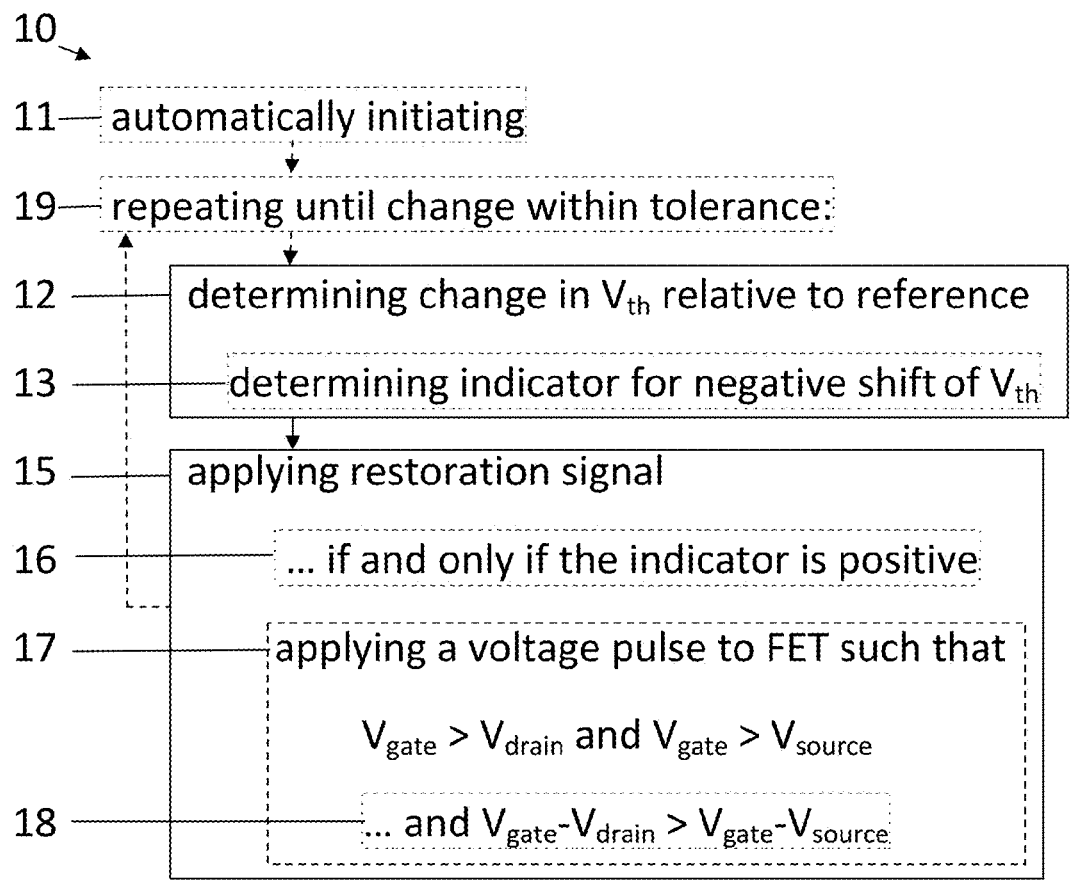
FIG. 1 shows a flowchart of a method according to embodiments of the present disclosure.

Referring to FIG. 1, an example method 10 according to embodiments of the first aspect of the present disclosure is illustrated. This method 10 is intended for at least partially compensating or at least partially correcting, e.g. for substantially completely or even completely compensating or correcting, a change in threshold voltage level $V_{th}$ of a field-effect transistor induced by OFF-state stress degradation. In one example, substantially completely compensating or correcting means that the compensated or corrected threshold voltage level deviates less than 10%, e.g. less than 5%, less than 2%, or less than 1%, of the original threshold voltage level before OSS degradation. The field-effect transistor may be a metal-oxide semiconductor field-effect transistor (MOSFET), e.g. an n-channel MOSFET or a P-channel MOSFET, a FinFET, a vertical FET, a planar FET, and the like.

Embodiments and examples of the present disclosure may be presented hereinbelow as relating primarily to n-channel MOSFET field-effect transistors. However, it will be clear to the person skilled in the art that such embodiments or examples may equally well relate to PMOS devices, allowing for minor and obvious changes where applicable. For example, an NMOS device may typically have a positive threshold voltage $V_{TH}$, e.g. in the range of 0 V to 1 V. For such NMOS device, the influence of OSS may be characterised as $V_{TH,stressed} < V_{TH,unstressed}$ or $\Delta V_{TH} < 0$. On the other hand, a PMOS device may typically have $V_{TH,unstressed} < 0$, e.g. in the range of −1V to −0.1V. Thus in a PMOS device, $V_{TH,unstressed} < V_{TH,stressed} < 0$ or $\Delta V_{TH} > 0$.

Principles of restoring the threshold voltage after OSS-induced shift therefore equally apply to PMOS devices as to NMOS devices, however the opposite sign of the PMOS polarity may have to be taken into account were appropriate, e.g. reference to a gate-drain voltage VGD being greater than a gate-source voltage VGS may, in case of a PMOS, be interpreted as actually referring to Abs(VGD)>Abs(VGS).

The field-effect transistor may for example be implemented as a Fin-FET, a vertical FET or a planar FET, or in general any configuration or variation of a MOSFET as known in the art. Particularly, the field-effect transistor may be a high-κ metal gate (HKMG) field-effect transistor, e.g. the field-effect transistor may comprise a metal gate component, for example instead of a poly-silicon gate component, and a high-κ gate dielectric, for example a material with a high dielectric constant κ as compared to silicon dioxide, such as for instance $Al_2O_3$, $Ta_2O_5$, $HfO_2$, $ZrO_2$, HfSiO, $La_2O_3$ and $LaAlO_3$. This high-high-κ gate dielectric may particularly be provided in a layer having a thickness of 4.0 nm or less, such as 2.3 nm or a thickness of 2.0 nm or less, e.g. of 1.0 nm. Such HKMG FET may also comprise an interfacial layer, e.g. an interfacial silicon dioxide $SiO_2$ layer, having a thickness of 2.0 nm or less, e.g. 1.4 nm.

The method 10 may, according to embodiments, comprise initiating, for instance automatically initiating 11, the steps of determining 12 a signal indicative of the change in threshold voltage level and applying 15 a restoration signal. The automatic initiation may for example be an automatic initiation when at least a predetermined number of operations have been performed by the field-effect transistor since the previous cycle, e.g. the previous determining 12 of the signal indicative of the change in threshold voltage level.

The method 10 comprises determining 12 a signal indicative of a change in threshold voltage level of the field-effect transistor with respect to a reference threshold voltage level. In specific embodiments of the present disclosure, this determining 12 of the signal may comprise determining the reference threshold voltage level as the threshold voltage level of a reference field-effect transistor, e.g. a substantially similar field-effect transistor which may be provided close to the field-effect transistor on the substrate and which is known to, or can be assumed to, be exposed to less OSS degradation than the field-effect transistor at hand, or even to substantially no OSS degradation. Alternatively, determining 12 the signal indicative of a change in threshold voltage level of the field-effect transistor with respect to a reference threshold voltage level may comprise determining the non-degraded threshold voltage level of a plurality, for instance each, of the transistors in a device as reference threshold voltage levels. For example, the reference threshold voltage levels for a plurality of field-effect transistors may be stored in an array, e.g. in a memory. Thus, determining 12 the signal may comprise determining, for each transistor, a signal indicative of a change between its reference voltage level and its current threshold voltage level after degradation. This way, inevitable variability in transistors is taken into account.

Determining the signal indicative of the change in threshold voltage level may comprise determining 13 a Boolean indicator value for indicating whether the threshold voltage has shifted in the negative direction by at least a predetermined amount with respect to the reference threshold voltage level. It is an advantage of embodiments of the present disclosure that degradation due to OFF-state stress can be easily distinguished from other sources of degradation, e.g. due to a non-negligible negative shift of the threshold voltage $V_{th}$.

The method 10 also comprises applying 15 a restoration signal to the field-effect transistor, in which this restoration signal is adapted for shifting the threshold voltage level $V_{th}$ of the field-effect transistor in a direction having opposite sign with respect to the change in threshold voltage level.

Applying 15 the restoration signal is furthermore taking into account the signal indicative of the change in threshold voltage level. Applying this restoration signal may take into account the signal indicative of the change in threshold voltage level by applying 16 the bias voltage if, or if and only if, the Boolean indicator value is equal to True, e.g. if the Boolean indicator value is positive.

The step of determining 12 the signal indicative of the change in threshold voltage level $V_{th}$ and the step of applying 15 the restoration signal to the field-effect transistor may furthermore be repeated 19 until the signal indicative of the change in threshold voltage level indicates that the change in threshold voltage level is within a predetermined tolerance, for example until the Boolean indicator value is equal to False.

Applying 15 the restoration signal may comprise applying 17 at least one voltage pulse to the field-effect transistor, e.g. at least one voltage pulse of a predetermined duration and a predetermined positive voltage level. The at least one voltage pulse may for example be supplied to the gate terminal, while electrically grounding a body, a source and a drain terminal of the field-effect transistor. It is an advantage of embodiments which supply a voltage pulse of predetermined duration and positive voltage to the gate while grounding the body, source and drain that a simple and easy to implement method is provided.

In applying 17 at least one voltage pulse to the field-effect transistor, a gate terminal of the field-effect transistor may be connected to a higher voltage level than both a drain terminal of the field-effect transistor and a source terminal of the field-effect transistor. For example, applying 15 the restoration signal may comprise applying 17 the at least one voltage pulse to the field-effect transistor by connecting the gate terminal to a voltage higher than the voltage potential of the drain terminal and higher than the voltage potential of the source terminal, e.g. $V_{gate} > V_{drain}$ and $V_{gate} > V_{source}$.

Furthermore, applying 17 the at least one voltage pulse may comprise applying 18 the at least one voltage pulse to the field-effect transistor in which a voltage difference between the gate terminal and the drain terminal is larger than a voltage difference between the gate terminal and the source terminal, e.g. $V_{gate} - V_{drain} > V_{gate} - V_{source}$. It is an advantage of embodiments of the present disclosure that a higher abundance of charges trapped in defects closer to the drain in the channel can be efficiently corrected.

For example, a method 10 according to embodiments may be performed by a particular electronic circuit designed to check if the degradation of a specific field-effect transistor, e.g. a MOSFET component, due to OSS reaches a given amount in terms of negative $V_{th}$ shift. If the alarm level thus defined is reached, this circuit may generate an appropriate signal, the restoration signal, in order to balance the negative $V_{th}$ shift. Thus, the positive $V_{th}$ shift to compensate the OSS induced negative shift may be obtained in a controlled way, until the initial $V_{th}$ value is substantially restored, e.g. within a predetermined tolerance, by applying an appropriate restoration signal.

The method may for example comprise checking the MOSFET periodically or checking the MOSFET in response to a specific user request.

In a larger system, such as in a memory module or a FPGA, numerous MOSFETs may be checked and compensated for OSS damage. Although all the MOSFETs in such larger system may be degraded by such stress, it is possible in accordance with embodiments of the present disclosure, although the disclosure is not limited thereto, to apply the method 10 for OSS compensation only to the MOSFETs on the most critical paths in the system.

The restoration signal may be a single set of bias conditions, e.g. a single predetermined pulse, or may be a more complex programming pulse sequence, as will be further discussed hereinbelow.

It is to be noted that specific aspects of the design of the restoration signal, such as, for example, voltage levels, pulse duration or linear or nonlinear relations between properties of such pulses in a complex pulse sequence may depend on specific implementation details of the gate stack and junction implant conditions of the field-effect transistor. The person skilled in the art will understand how to determine a suitable restoration signal in accordance with embodiments of the present disclosure, for example by performing an initial calibration for a specific type of device, or for a specific device when implemented in a larger system.

Different example embodiments of a method 10 according to the present disclosure will be presented hereinbelow in order to illustrate concepts of the present disclosure. The example embodiments that follow are roughly ordered from simple and easy to implement to complex and particularly efficient. When implementing such methods in a circuit, it is evident that this complexity trade-off may also affect the complexity of the circuit, and therefor also implies a cost trade-off in terms of price and/or semiconductor substrate area.

For example, the first example embodiment may perform a check of $V_{th}$ shift due to OSS in a device under test, e.g. the field-effect transistor. If an alert value is detected, one single correction pulse may be applied, such that an at least partial compensation for OSS is obtained.

The second example embodiment may check the $V_{th}$ shift due to OSS in the device under test, and if an alert value is detected, a series of pulses may be applied, until the initial $V_{th}$ is (at least partially) restored.

In a third example embodiment, the $V_{th}$ shift due to OSS is checked in the device under test, and if an alert value is detected, a series of multiple pulses may be applied, in which the bias conditions on each pulse or group of pulses is adjusted by taking into account the reaction of the device.

Figure 2:
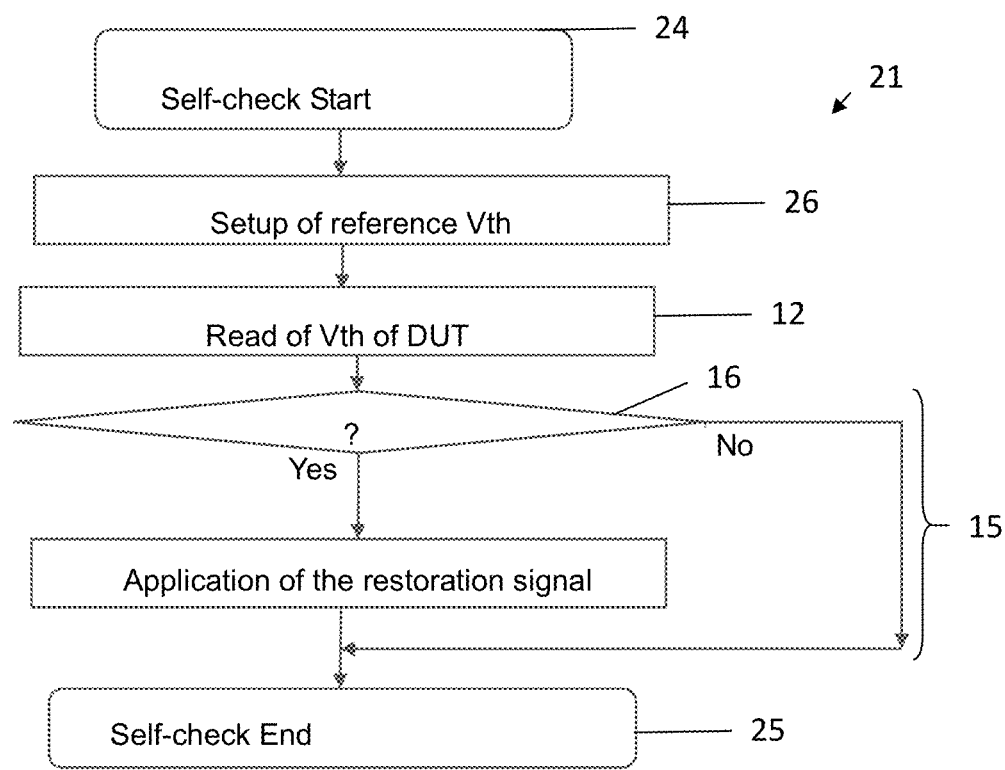
FIG. 2 shows a first example process flowchart of a method according to embodiments of the present disclosure.

FIG. 2 shows a flowchart for a method 21 according to the first example embodiment of the first aspect of the present disclosure. Running from start 24 to end 25 of the process flow, the following steps may be executed: first, a reference $V_{th}$ value is established 26, the $V_{th}$ of the device under test (DUT) is read 12, and the restoration pulse is applied 15 taking into account the conditional test 16 for a deviation of $V_{th}$ by more than by a predetermined threshold from the reference value.

The start 24 of the process flow may be triggered by an external input, e.g. a user command. Alternatively, the start 24 of the process flow may be automatically initiated 11 by an internal input, e.g. any internally generated signal that restores the OSS incurred by a FET and so prevents malfunctions of the FET will suffice. This internal signal can for instance be based on a time-out or it can relate to real activity, e.g. when a given number of operations, e.g. actions performed on the basis of one or more instructions, in the circuitry is reached. As an example only, not intended to be limiting for the present disclosure, the internal signal may be generated for a memory module, when the block of memory has performed a given number of programming and/or reading operations. The reference $V_{th}$ value may be established 26 by a fixed value for all devices, e.g. a hardwired or hardcoded value which works reasonably over a wide range of devices. Alternatively, the reference $V_{th}$ value may be a stored value, specific for the type of device, e.g. for the specific type of field-effect transistor being tested. The reference $V_{th}$ value may also be compared with the initial $V_{th}$ for the specific device being tested, e.g. a stored value in a dedicated memory element. In embodiments of the present disclosure, a memory element may for example store a plurality of reference $V_{th}$ values, each corresponding to one of a plurality of field-effect transistors which can be selected as the field-effect transistor under test. The reference $V_{th}$ value may also be retrieved from a reference fresh device with similar or substantially equal properties. Such reference device may for example be located in the semiconductor region close to the device under test in order to advantageously minimize the local process variations.

The conditional test 16 may determine whether the threshold voltage $V_{th}$ of the DUT is lower than the reference $V_{th}$ taking a suitable, e.g. a predetermined, error margin into account. If not, the procedure may end 25. If the $V_{th}$ is lower than the reference $V_{th}$ value by a predetermined margin, the restoration signal 15 is applied to the device. This restoration signal may be a single pulse to restore, or at least partially restore, the initial $V_{th}$ of the DUT. This signal may be supplied by applying a positive bias on the Gate, in which the application time and voltage may be according to a predetermined value, while Source, Drain and Body are grounded.

Figure 3:
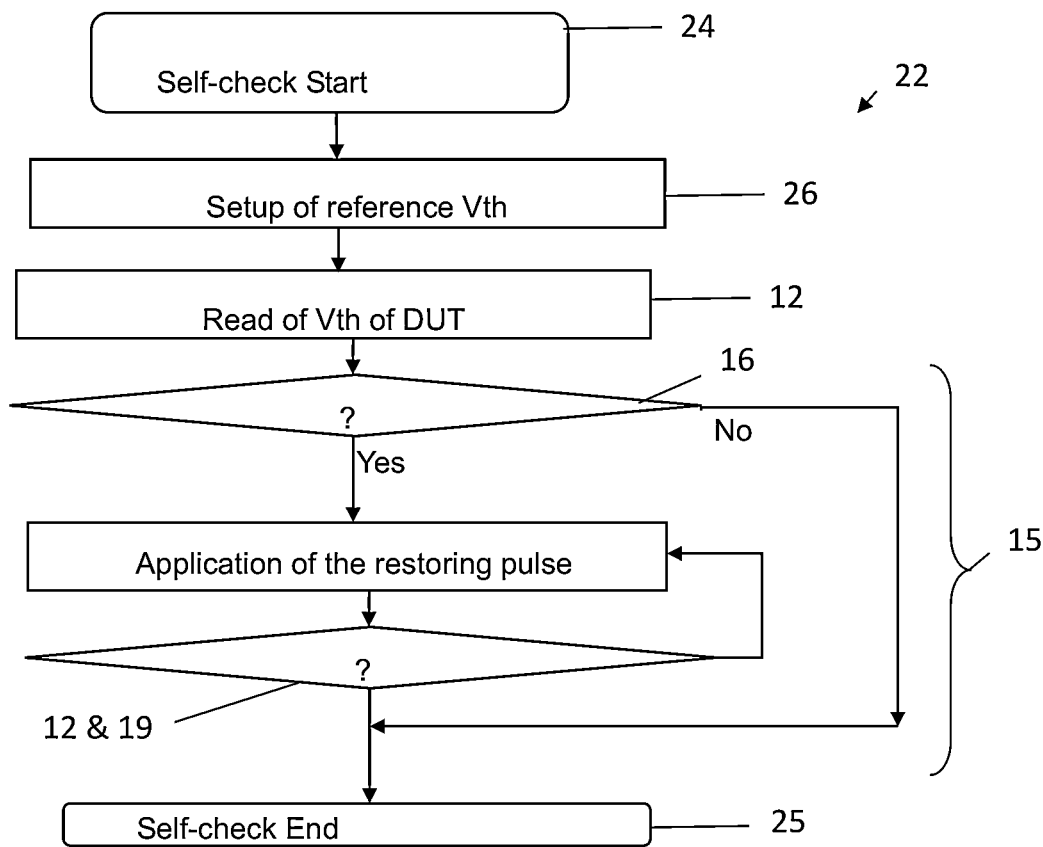
FIG. 3 shows a second example process flowchart of a method according to embodiments of the present disclosure.

FIG. 3 shows a flowchart for a method 22 according to the second example embodiment of the first aspect of the present disclosure, which may be slightly more complex. The method 22 is similar to the method 21, but comprises an additional loop 19. If after the n−1'th restoring step, the $V_{th}$ of the DUT is higher than the reference $V_{th}$, or within a predetermined error margin, the procedure will end 25. If not, an additional restoration signal is applied in the n'th restoring step.

Figure 4:
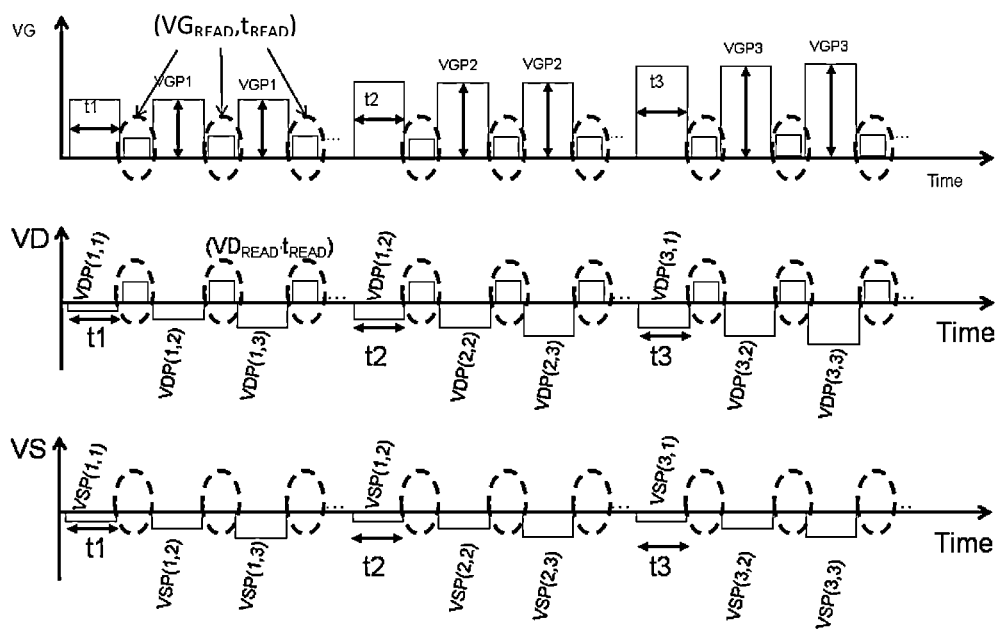
FIG. 4 illustrates a first example pulse sequence of a restoration signal for use in embodiments of the present disclosure.

A sequence of restoration pulses in accordance with this second example embodiment is shown in FIG. 4. In this example sequence, the gate bias voltage VG is increasing for each consecutive group of pulses. Furthermore, the drain bias voltage VD is increasing for each pulse in a group of pulses, but restarts from a lower bias for each group of pulses. The source voltage VS is following the VD, but at a lower intensity, e.g. VS=a·VD for each pulse where a is a predetermined positive scaling constant strictly less than one.

An example of values for the pulses can be as listed in the following table. However, it should be noted that appropriate values may be affected by specific device characteristics, as will be apparent to the skilled person. Such appropriate values may for example be obtained by routine experimentation, e.g. by rescaling the present example values.

The example values given hereinunder are for an experimental gate stack which comprises the following layers:
- an interfacial layer, e.g. comprising a chemical oxide, ozonated oxide or thermal oxide and/or formed by an ultraviolet ozone (UVO) oxidation process from a chemical oxide, for example an interfacial layer comprising in the range of 0.5 nm to 2.0 nm of $SiO_2$/SiON for low-voltage applications, such as a 1.2 nm thick $SiO_2$ interfacial layer, or in the range of 2 nm to 15 nm for high-voltage applications;
- a high-κ dielectric material layer, such as a $HfO_2$-based dielectric, for example having a thickness in the range from 1 nm to 3 nm, e.g. 2 nm, or based on another high-κ dielectric, such as HfSiOx, $ZrO_2$, $Al_2O_3$, $Ta_2O_5$, $HfO_2$, $ZrO_2$, HfSiO, $La_2O_3$ or $LaAlO_3$;
- a metal gate, having a thickness in the range of 2 nm to 10 nm, e.g. 5 nm, comprising at least one layer of TiN and/or TaN, for example deposited by PVD or ALD; alternatively $V_{th}$ tuning materials can be used as well, e.g. La doped, Mg doped, Dy doped, . . . for NMOS or $Al/Al_2O_3$ doped for PMOS;
- a 100 nm thick poly-$SiO_2$ may be provided as covering layer in a gate-first approach, or, in a gate-last approach, filing metal such as W— may be provided as covering layer,
- and then a 10 nm thick silicide, e.g. NiPtSi, to get a working device (however, not specifically needed in terms of requirements for the present disclosure).

For this set-up, suitable pulses were as follows:

| | | |
|---|---|---|
| VGP1 = 1.0 V | VGP2 = 1.2 V | VGP3 = 1.4 V |
| VDP(1, 1) = −0.4 V | VDP(1, 2) = −0.6 V | VDP(1, 3) = −0.8 V |
| VDP(2, 1) = −0.6 V | VDP(2, 2) = −0.8 V | VDP(2, 3) = −1.0 V |
| VDP(3, 1) = −0.8 V | VDP(3, 2) = −1.0 V | VDP(3, 3) = −1.2 V |
| VSP(1, 1) = 0.0 V | VSP(1, 2) = −0.1 V | VSP(1, 3) = −0.2 V |
| VSP(2, 1) = 0.0 V | VSP(2, 2) = −0.1 V | VSP(2, 3) = −0.2 V |
| VSP(3, 1) = 0.0 V | VSP(3, 2) = −0.1 V | VSP(3, 3) = −0.2 V |

Furthermore, the time intervals t1, t2, t3 could be in the range of 100 ms. For reading out $V_{TH}$, a readout voltage $VG_{READ}$=0.1V could be applied, or $VG_{READ}$ may be swept between 0.05 V and 0.15 V. The drain readout voltage could be for example $VD_{READ}$=0.05V. This sequence in accordance with the second example embodiment could be characterized as an incremental, linear approach.

A method according to the third example embodiment of the first aspect of the present disclosure may again be illustrated by the flowchart in FIG. 2, but in this example embodiment, the restoration signal may comprise a complex sequence of restoring pulses. Here, a more articulated bias condition may be applied to substantially restore the initial $V_{th}$ of the DUT. In this sequence, the electric field between Gate and Drain is gradually increased, and at the same time the field between Gate-Source and Gate-Body is increased by a lower value. A comparison between the current threshold voltage $V_{TH}$ of the DUT and the reference value is performed in various steps, until an appropriate reduction of the discrepancy is reached.

Figure 5:
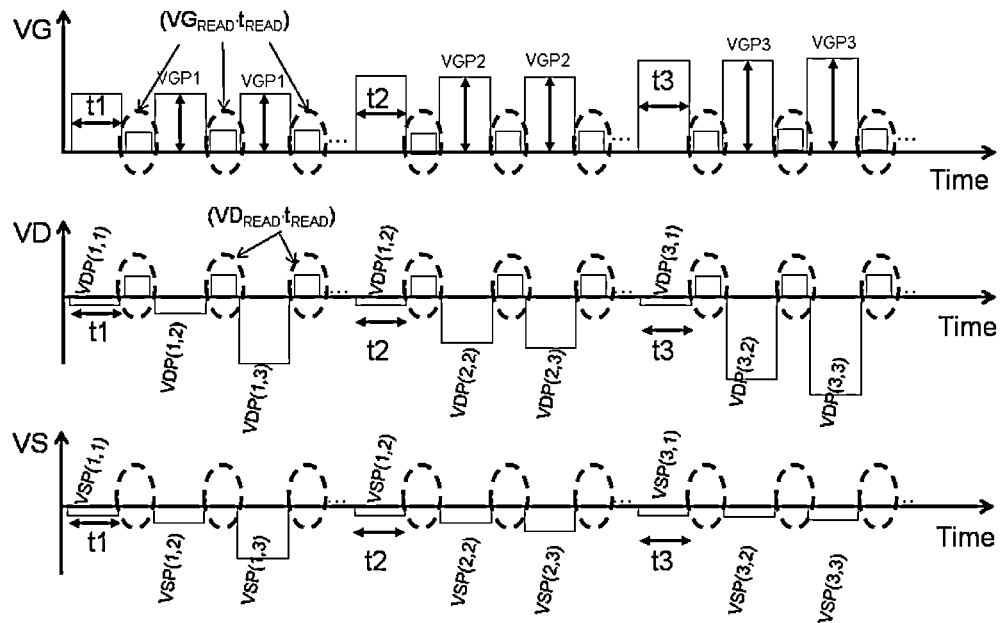
FIG. 5 illustrates a second example pulse sequence of a restoration signal for use in embodiments of the present disclosure.

A sequence of restoration pulses in accordance with this third example embodiment is shown in FIG. 5. In this example sequence, as in the sequence shown in FIG. 4, the gate bias voltage VG is increasing for each consecutive group of pulses. Furthermore, the drain bias voltage VD is also increasing for each pulse in a group of pulses, and also restarts from a lower bias for each group of pulses. Furthermore, also the source voltage VS is following the VD, but at a lower intensity. However, this sequence of pulses for the third example method embodiment may be based on an adaptive algorithm, where both VS and VD are adjusted on the basis of the last obtained threshold voltage $V_{th}$ reading. The bias that is applied to VD does not simply depend on the previous VD bias voltage by a simple linear increment, but is derived by a calculation based on the results of the previous correction steps.

Such adaptive algorithm may for example take a response function of the threshold voltage shift $\Delta V_{th}$ with respect to the applied bias into account. Thus, a functional dependency $\Delta V_{th}=f(VG,VS,VD,VB)$ may be calculated from a theoretical response model or may be determined empirically or semi-empirically. For example, a response model $\Delta Vth=f(VG,VS,VD,VB)$ may be estimated by using the first pulses in a sequence, e.g. may be determined by interpolation or by fitting at least one free parameter of an analytical model. Then, this mathematical model may be used to determine an optimized combination of bias values to correct the DUT. This optimized sequence may furthermore be determined by taking time, power consumption, heat dissipation or other considerations into account. The optimal combination may be an optimum in a discrete sense, e.g. a best choice for a specific criterion, e.g. time and/or power efficiency, may be chosen from a plurality of candidate pulses or pulse sequences, or in a continuous sense, e.g. a value or set of values, such as voltage levels and pulse durations, may be chosen from a range as a best choice for such specific criterion. The optimized combination may also be optimized in the sense of selected to satisfy at least one requirements criterion, e.g. restoring the $V_{TH}$ to within a specified tolerance region within an available timeslot, without optimizing parameters in the sense of necessarily obtaining a maximum efficiency.

For example, estimation by using the first pulses in a sequence may start with three applied biases:

| VGP1 = 1.0 V | VDP(1, 1) = −0.1 | VSP(1, 1) = 0 |
|---|---|---|
| VGP1 = 1.0 V | VDP(2, 1) = −0.2 | VSP(2, 1) = 0 |
| VGP1 = 1.0 V | VDP(3, 1) = −0.4 | VSP(3, 1) = VDP(3, 1)/2 |

By using the $V_{TH}$ read after each pulse, an initial approximation of f(VG,VS,VD,VB) can be obtained for f(1.0V, −0.2<VS<0, −0.4<VD<−0.1, 0), e.g. a linear interpolation model.

Next, another VG and VDP may be applied, e.g. VGP2=1.2V, VDP(1,2)=−0.5V, such that, assuming f(VG=1.2V, x, y, 0)=b. f(VG=1.2V, x, y, 0), the multiplication factor b can be determined to characterize the function f for VG=1.2V.

Two other pulses can then be applied, e.g.

VGP2=1.2 V VDP(2.2)=−0.7 V VSP(2,2)=VDP(2, 2)/2 and then,

VDP(3,2)=−1.0 V VSP(3,2)=VSP(3,2)/2

Alternatively, instead of increasing VDP, VG may be increased. A possible criterion to decide whether to increase VG immediately, may be if the required restoration is larger and the restoration procedure is slower. On the contrary, if the restoration is already fast enough, an increase in VG can be avoided. In such procedure, larger, slower and fast enough may be relative terms determined by properties of the specific device under test and operational requirements, as will be understood by the person skilled in the art. Furthermore, as will be apparent to the person skilled in the art, a larger number of pulses could be applied before determining a suitable increase of VG, e.g. six VDP pulses could be applied before effecting an increase of VG.

An example of values for the pulses can be as listed in following table. However, it should be noted that appropriate values may be affected by specific device characteristics, as will be apparent to the skilled person. The set-up for where the below values are suitable, is as above with respect to FIG. 4.

| VGP1 = 1.0 V | VGP2 = 1.2 V | VGP3 = 1.4 V |
|---|---|---|
| VDP(1, 1) = −0.1 V | VDP(1, 2) = −0.5 V | VDP(1, 3) = −0.6 V |
| VDP(2, 1) = −0.2 V | VDP(2, 2) = −0.7 V | VDP(2, 3) = −1.0 V |
| VDP(3, 1) = −0.1 V | VDP(3, 2) = −1.0 V | VDP(3, 3) = −1.2 V |
| VSP(1, 1) = 0.0 V | VSP(1, 2) = VDP(1, 2)/2 | VSP(1, 3) = VDP(1, 1)/2 |
| VSP(2, 1) = 0.0 V | VSP(2, 2) = VDP(2, 2)/2 | VSP(2, 3) = VDP(2, 3)/2 |
| VSP(3, 1) = 0.0 V | VSP(3, 2) = VSP(3, 2)/2 | VSP(3, 3) = VSP(3, 3)/2 |

Figure 6:
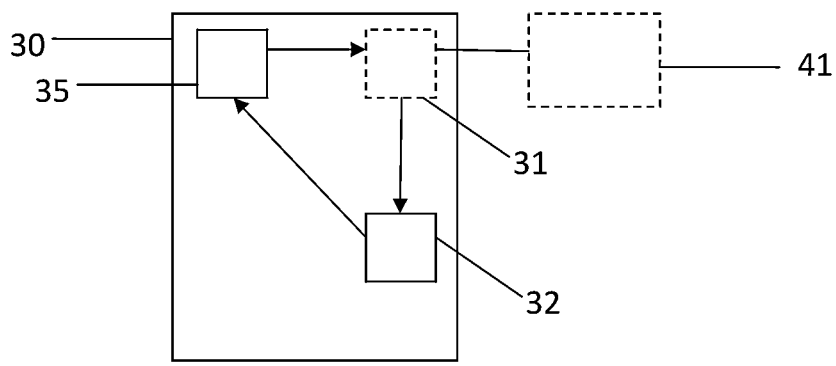
FIG. 6 shows an integrated circuit component according to embodiments of the present disclosure.

In a second aspect, the present disclosure relates to an integrated circuit component. Referring to FIG. 6, such integrated circuit component 30 according to embodiments of the present disclosure is schematically shown. The integrated circuit component 30 is specifically adapted for at least partially compensating for a change in threshold voltage level of a field-effect transistor 41 induced by OFF-state stress degradation. The integrated circuit component may comprise input/output means 31 for connecting to the field-effect transistor. Such input/output means 31 may be a simple electrical connection, but may also comprise multiplexing means, e.g. for selecting a field-effect transistor in which to compensate for OSS effects among a plurality of connected field-effect transistors.

The integrated circuit component 30 comprises a detection means 32 for determining 12 a signal indicative of a change in threshold voltage level of the field-effect transistor with respect to a reference threshold voltage level.

The integrated circuit component 30 also comprises a signal generating means 35 for applying 15 a restoration signal to the field-effect transistor. This signal generating means is specifically adapted for supplying a restoration signal to the field-effect transistor such that the threshold voltage level of the field-effect transistor is shifted in a direction having opposite sign with respect to the change in threshold voltage level. The signal generating means 35 is furthermore adapted for applying the restoration signal by taking the signal indicative of the change in threshold voltage level into account.

The integrated circuit component 30 may be adapted for implementing any or each method according to embodiments of the first aspect of the present disclosure. For example, the detection means 32 for determining 12 the signal may be adapted for determining a Boolean indicator value for indicating whether the threshold voltage $V_{th}$ has shifted in the negative direction by at least a predetermined amount with respect to the reference threshold voltage level. Furthermore, the signal generating means 35 may be adapted for applying the restoration signal if the Boolean indicator value is equal to true.

The integrated circuit component 30 may comprise a procedural loop means for directing the detection means 32 and the signal generating means 35 such that the determining of the signal indicative of the change in threshold voltage level and the application of the restoration signal are repeated until the signal indicative of the change in threshold voltage level indicates that the change in threshold voltage level is within a predetermined tolerance range.

The signal generating means 35 may be adapted for applying the restoration signal such that at least one voltage pulse is applied to the field-effect transistor. This voltage pulse may be applied by connecting a gate terminal of the field-effect transistor to a higher voltage level than a drain terminal of the field-effect transistor. This voltage level provided to the gate terminal may also be higher than the electric potential at a source terminal of the field-effect transistor. Furthermore, the voltage pulse may be provided such that a voltage difference between the gate terminal and the drain terminal is larger than a voltage difference between the gate terminal and the source terminal.

The signal generating means 35 may also be adapted for calculating a source bias voltage and a drain bias voltage taking into account the signal indicative of the change in threshold voltage level of the field-effect transistor with respect to the reference threshold voltage level, for example, a higher potential difference may be applied over gate and drain when a larger change in threshold voltage level relative to the reference threshold voltage level is detected.

In an advantageously simple integrated circuit component 30 according to embodiments of the present disclosure, the signal generating means 35 may be adapted for applying at least one voltage pulse of a predetermined duration and a predetermined positive voltage level to the gate terminal, while electrically grounding a body of the field-effect transistor, the source terminal and the drain terminal.

The integrated circuit component 30 may also comprise an initialization means for automatically initiating 11 the determining 12 of the signal and the applying 15 of the restoration signal when at least a predetermined number of operations were performed by the field-effect transistor since a previous determining 12 of the signal indicative of the change in threshold voltage level.

Figure 7:
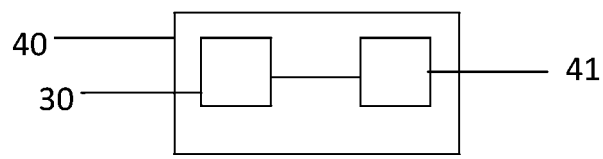
FIG. 7 shows an integrated semiconductor device according to embodiments of the present disclosure.

In a third aspect, the present disclosure relates to an integrated semiconductor device. FIG. 7 illustrates such an integrated semiconductor device 40 according to embodiments of the present disclosure. The integrated semiconductor device 40 comprises at least one field-effect transistor 41 and an integrated circuit component 30 according to the second aspect of the present disclosure for at least partially compensating for a change in threshold voltage level of the at least one field-effect transistor 41 induced by OFF-state stress degradation. The at least one field-effect transistor may comprise an n-channel and/or p-channel metal-oxide semiconductor field-effect transistor (MOSFET). Any or each field-effect transistor 41 may comprise a high-κ gate dielectric, such as zirconium dioxide or hafnium dioxide, and a metal gate. Any or each field-effect transistor 41 may be a fin-FET or a planar FET. The at least one field-effect transistor 41 may comprise an ultrathin gate stack, e.g. having a low equivalent oxide thickness (EOT), e.g. 2.0 nm or less, e.g. 1.4 nm, or even less, e.g. 0.8 nm.

For example a field-effect transistor 41 may comprise a gate stack which comprises an interfacial layer of $SiO_2$, e.g. having a thickness of substantially 1 nm. Such gate stack may further comprise, for example, 1.2 nm of ISSG. A $SiO_2$/SiON or RTO layer having a thickness in the range of 0.5 nm to 1.8 nm may be another example. A layer of 1 nm thickness or less comprising a chemical oxide, ozonated oxide or thermal oxide, and/or formed by an ultraviolet ozone (UVO) oxidation process from a chemical oxide may for example be another option.

Furthermore, the high-K gate dielectric layer may comprise a $HfO_2$ layer, e.g. having a thickness in the range of 1 nm to 3 nm, e.g. a 2 nm thickness. HfSiOx may be another option, as well as other high-K materials such as $ZrO_2$.

The metal gate of such HKMG FET may comprise a layer of titanium nitride (TiN), for example having a thickness in the range of 2 nm to 10 nm, e.g. a thickness of 5 nm. Such layer may be deposited by PVD or ALD. Furthermore, threshold voltage tuning materials may be used as well, for example La doped or Mg doped material for NMOS, or $AlO_3$ doped material for PMOS. The gate stack may also comprise a polysilicon top layer, e.g. 100 nm Si. Typical semiconductor devices may for example require at least 10 nm of silicide for normal operation.

In particular, the integrated semiconductor device may be a memory module, e.g. a DRAM module, a field-programmable gate array (FPGA) or a system-on-chip (SoC) device. For example, in a System-on-Chip (SoC) device, the Input/Output (I/O) circuits may be fabricated by dual gate oxide dielectrics, using a thick poly-$SiO_2$ in addition to the high-K/Metal Gate (HKMG) required by the faster part of the circuitry. To optimize the final cost, common HKMG platforms for both I/O and logic parts may be used, thereby increasing the thickness of the Interfacial Layer (IL) in comparison with the most advanced logic parts. For example, a framework may be provided for "cheap periphery" of memory, where a single gate oxide based on a high-K dielectric is used for managing the array and at least part of the analog blocks.

It is known that the circuital blocks of state-of-the-art memory modules include multiple parts. Examples are devices designed for purely logic operations or for analog operations. In some areas, the main design concern may be the area reduction, in others reliability. It is to be noted that for memory HKMG FETs may be currently avoided, e.g. because they may be too expensive. However, the speed requirements are becoming more and more demanding. Therefore, HKMG technology may be introduced in high-volume manufactured memory modules in the near future. The first type of memory module where the HKMG will be introduced could be a DRAM, or an emerging memory targeting DRAM replacement, due to the high speed requirement. In the future, other memory technologies could also follow such trend.

The DRAM therefore could be the first memory circuit including HKMG. These types of circuits typically tend to be more cost-effective than logic. For the same technology node, the push to introduce in a more extensive way the HKMG also for analog component is stronger than the logic.

Therefore, specific circuital blocks that are currently realized by non-HKMG technology, e.g. $SiO_2$ or SiON, are likely to migrate to HKMG technology in the future. This implies that OSS could definitely represent a problem for such devices.

A method or device according to embodiments of the present disclosure may be used for at least partially correcting the detrimental effects of OSS in a memory array circuit. However, such method or device may find other applications. For example, embodiments of the present disclosure may be used in a circuit for Logic oriented solution, if the circuitry is exposed to OSS condition. Furthermore, a method or device according to embodiments may also be adapted to compensate for other stress conditions, such as bias temperature instability (BTI), in addition to OSS.

Although a device according to embodiments of the present disclosure may be particularly suitable for monitoring of the $V_{TH}$ shift and to perform inline correction for OSS induced shift, thereby advantageously reducing the aging of the device, the same correction concept may be applied even before bringing the device in use, e.g. before selling the device. This may be considered as a process optimization by electrical trim. Therefore, implementation of a circuit component according to embodiments of the present disclosure is not required, because the input/output signals can be arranged by some external part which may be re-used for trimming different products. If a circuit is used to trim the threshold voltage $V_{TH}$ at or soon after manufacture of the device under test, this may also be easily extended to guarantee the $V_{TH}$ conservation during time.

In an example demonstrating principles of the present disclosure, where the present disclosure is not intended to be limited by such considerations, the impact of OFF-State Stress (OSS) on an nMOSFET using High-K/Metal Gate (HKMG) technology is demonstrated. Although in standard poly-$SiO_2$/SiON devices the impact of OSS is relatively limited and causes an increase in $V_{th}$, in the case of HKMG the $V_{th}$ shift is surprisingly negative instead, and the degradation is furthermore amplified for a given channel length. Therefore the detrimental impact on the device leakage may be extremely important, causing a serious issue for high voltage and low power oriented circuits.

The different trend of degradation with respect to stressing condition and temperature are presented hereinbelow for a HKMG device as compared to a poly-$SiO_2$/SiON device, as well as the relaxation mechanisms.

The devices used for this example were fabricated on (001)/<100> silicon substrates, in the 300 mm facility of IMEC, with a process flow specifically designed for low cost and low power applications. The integration scheme is based on HKMG/Metal Inserted Poly Si gate (MIPS). After growing a thin Interfacial Layer (IL) of Silicon dioxide, a 2 nm layer of $HfO_2$ is deposited, with additional TiN to complete the gate stack deposition. The Equivalent Oxide Thickness (EOT) was 1.5 nm. The stress conditions for OSS were applied by grounding Source, Body and Gate, while the Drain was stressed by using different biases. $V_{th}$ was defined by using a reference current criteria of $I_D$=(1 µA/m)·L. Even though the minimum available gate length for this technology is shorter than for conventional polysilicon technology, a longer channel of 50 nm was used to meet the requirements of the I/O device. In order to compare to a thicker standard I/O, devices with poly-SiON gate stack were fabricated, using the same implant scheme. In this case, an EOT of 2.0 nm was obtained.

Figure 8:
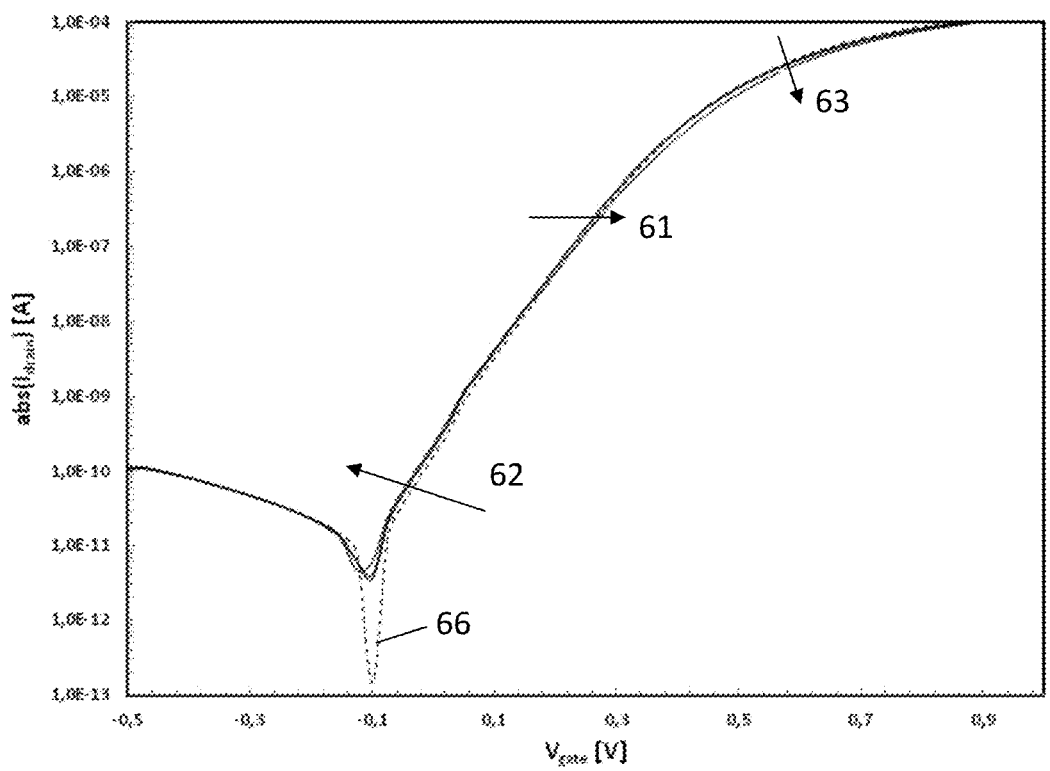
FIG. 8 shows the ID vs VG curves measured at VD=1.0V under increasing stress condition on a poly-SiON device stressed under OSS condition (applied stress bias VD=3.0V, VG=0V, VS=VB=0V) to demonstrate the effect of OFF-state stress on such device as already known in the art.

To confirm the effect of OSS on poly-SiON devices as already known in the art, different $I_D$ versus $V_G$ curves were measured for devices stressed under various conditions and at T=125 C. FIG. 8 shows the $I_D$ vs $V_G$ curves measured at VD=1.0V on a device stressed in OFF conditions (VG=VS=VB=0V, VD=2.75V). The dashed line 66 indicates the reference curve before applying the OSS stress condition.

Increasing the stress time, here shown for stress times of 388 s, 888 s and 1888 s, caused a positive $V_{th}$ shift 61, a sub-threshold slope (SS) degradation 62 and a $g_m$ maximum reduction 63, consistent with data found in the literature. Also, concerning the entity of the degradation, the same order of magnitude as previously reported in literature for similar technology was observed. The explanation of these degradation effects can be ascribed to two phenomena: holes could be injected in the $SiO_2$ material and act as positive fixed oxide charges at the gate drain overlap region and holes trapped at the Si—$SiO_2$ interface can capture an electron and behave therefore as interface traps.

Figure 9:
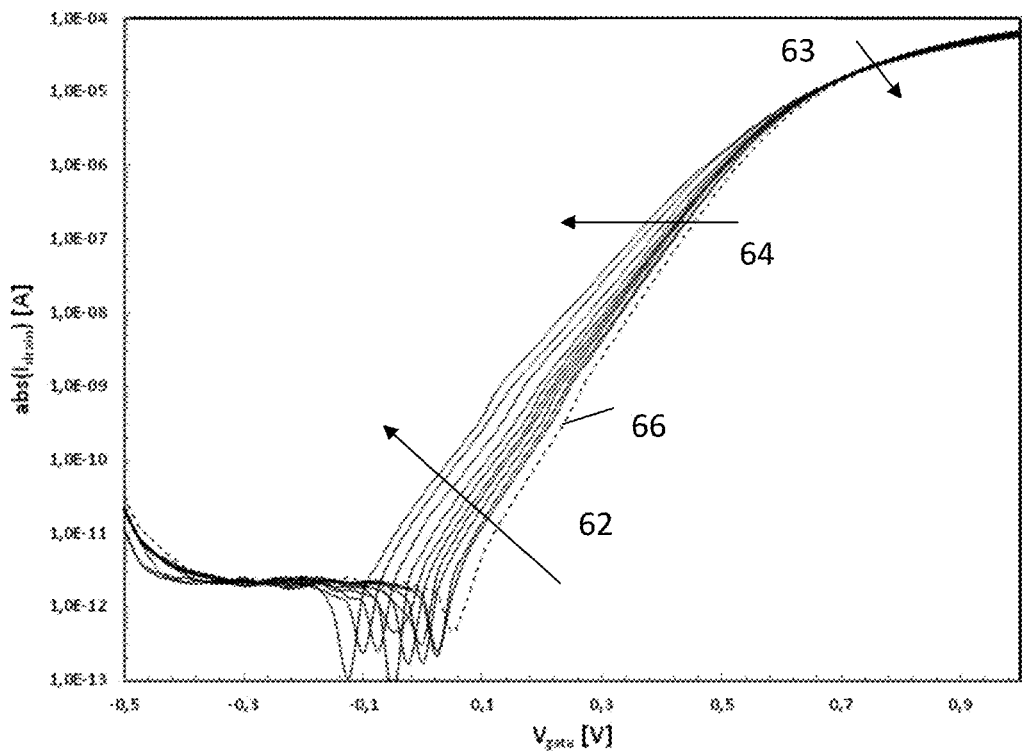
FIG. 9 shows the ID vs. VG curves measured at VD=1.0V on a HKMG device stressed under OFF condition to demonstrate the effect of OFF-state stress on such device for demonstrating principles of embodiments of the present disclosure.
Figure 10:
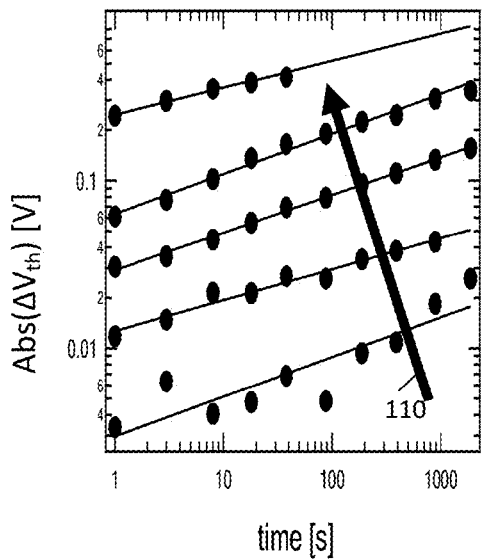
FIG. 10 shows the evolution of degradation vs. stress time for ΔVth in a HKMG device for demonstrating principles of embodiments of the present disclosure.
Figure 11:
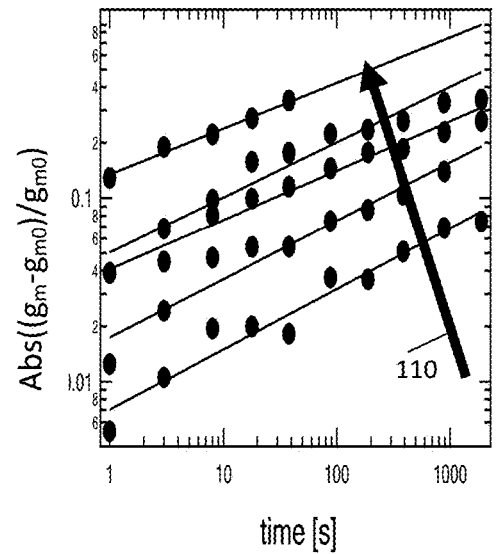
FIG. 11 shows the evolution of degradation vs. stress time for gm in a HKMG device for demonstrating principles of embodiments of the present disclosure. In this example, OSS causes a change of carrier mobility in the FET channel, i.e.

On the contrary, in the case of HKMG technology, in accordance with embodiments of the present disclosure, a different behaviour was observed. FIG. 9 shows the $I_D$ vs. $V_G$ curves measured at $V_D$=1.0V on a HKMG device stressed under OSS conditions, for stress times cumulating up to 1888 s. The implant conditions were the same for the devices used in FIG. 8 and FIG. 9, such that the only difference may be found in the gate stack. In the HKMG case three main degradation effects are visible: a negative $V_{th}$ shift 64, a SS degradation 62 and a $g_m$ maximum reduction 63. From a qualitative point of view, the main difference between HKMG and poly-SiON is the sign of the $V_{th}$ shift. From a quantitative point of view, the relative degradation is much higher. Assuming the same gate length and stress conditions for the lateral electric field, the analyzed NMOS devices, having a gate length of approximately 50 nm, show a $V_{th}$ shift of −100 mV after 1000 s of stress at $V_D$=2.75V. Also the $g_m$ is degraded, as visible in the $I_D$ current reduction at $V_G$=1.0V. Higher stress bias gives higher degradation, as can be observed in FIG. 10 to FIG. 12, where the impact of higher stressing bias is shown for $V_{th}$ (FIG. 10), $g_m$ (FIG. 11) and SS (FIG. 12). The applied drain voltage VD increases in the direction indicated by arrow 110 on FIG. 10 to FIG. 12.

The observed degradation trends in OSS are very different from the hot carrier injection effect on the HKMG, where in NMOS a positive $V_{th}$ shift with less dramatic SS degradation is observed. Concerning the trend with respect to temperature, higher degradation, e.g. an increased $V_{th}$ shift, is observed with higher temperature for HKMG, as shown in FIG. 13. The temperature increases in the direction indicated by arrow 111 on FIG. 13. This additional degradation can be explained by the increase in the carrier density and the impact ionization current at higher temperatures, in the regime of low Vg, similar to the case of poly-$SiO_2$. In fact, for poly-SiON devices, the Impact Ionization current in the low Vg was confirmed to increase with the temperature. As additional confirmation of the link between degradation and channel current, it was observed that no degradation is measured by leaving the Source floating. Furthermore, higher degradation is observed when increasing the lateral field between Source and Drain by reducing the Source bias.

FIG. 21 shows the absolute values of the source current $I_S$ 82, drain current $I_D$ 81, gate current $I_G$ 84 and bulk current $I_B$ 83 versus the drain voltage $V_D$ for the grounded source condition. $I_D$ is approximately equal to $I_S$ until $V_D$ reaches about 3.5V, then $I_S$ drops. $I_D$ is about equal to $I_B$. $I_G$ is measurable for $V_D$ larger than about 3V. $I_D$ is equal to about $2 \cdot 10^{-5}$ A at a drain voltage $V_D$=3.0V.

FIG. 22 shows the absolute values of the drain current $I_D$ 81, gate current $I_G$ 84 and bulk current $I_B$ 83 versus the drain voltage $V_D$ for the floating source condition. $I_D$ is approximately equal to $I_B$ until $V_D$ reaches about 5V. $I_G$ increases for $V_D$ larger than approximately 3V. $I_D$ and $I_B$ are equal to about $4 \cdot 10^{-7}$ A at a drain voltage $V_D$=3.0V.

It is worth mentioning that the impact of the OSS on the HKMG is different for low and high $V_G$. For low $V_G$, the main consequence may be the Off leakage due to lower $V_{TH}$ and degraded SS increase. However, for high $V_G$, the drain current $I_D$ is reduced due to the $g_m$ degradation, even when taking a partial compensation due to the negative $V_{th}$ shift into account.

The relaxation properties after the OSS stress are summarized in FIG. 14. After 2000 seconds of stress, the stressing bias on the gate is reduced to zero. In the following relaxation phase, the device shows a partial relaxation, but only a minor part of the degradation is recovered when the gate is grounded during the relaxation. The $V_{th}$ shift 71 of 100 mV is recovered by 10% (returning to 90 mV) at the end of the relaxation time, and the dynamics of the recovery is quite fast. Accordingly, the 100-fold $I_{D,OFF}$ 72 increase during the stress phase is reduced after the relaxation to 50 times.

FIG. 17 shows the initial drain current ID vs. the gate voltage VG curve 91 for VD=50 mV on a fresh device. After OSS stress at T=25 C and VD, stress=2.75V, the negative $V_{th}$ shift caused by OSS can be observed in curve 93. However, by applying a restoration signal to the device in accordance with embodiments of the present disclosure, it is possible to compensate the negative $V_{th}$ shift induced by OSS as demonstrated by curve 94.

An explanation of the observed degradation in the HKMG may be found in the hot holes injection generated by Impact Ionization, which occurs mainly in the gate/drain overlap region. Such theoretical considerations are provided in order to assist in understanding aspects of the present disclosure and in reducing aspects of the present disclosure to practice. However, it should be noted that such theoretical considerations are not intended to limit the disclosure in any way, and are provided without guarantee regarding completeness or validity of such considerations.

In the case of a poly-SiON device, the defects at the Si/SiO$_2$ interface are probably the main source of electrons trapping. However, in the bulk of the high-κ layer of the HKMG device, a higher density of bulk defects is present than in the SiO$_2$ layer of the poly-SiON device. This may enhance hole trapping, causing the pronounced negative $V_{th}$ shift as well as the enhanced electrostatic degradation in the devices, which may account for the increased SS and $g_m$ degradation observed. To estimate the location where the maximum degradation occurs, a calibrated TCAD deck in TSUPREMIV was used for a process simulation of the measured devices. The impact ionization current simulated by MEDICI is shown in FIG. 15 for the OSS condition of FIG. 9 (VG=VS=VB=0V, VD=2.75V). Source 101, Gate 102 and Drain 103 of the transistor device are indicated on FIG. 15. The impact ionization ranges from 1 cm$^{-3}$·s$^{-1}$ to 10$^{24}$ cm$^{-3}$·s$^{-1}$, black corresponding to the lowest value and white to the highest. The greyscale corresponds furthermore to a logarithmic scale over this range. It can be clearly seen that the location of Impact Ionization peak is located close to the drain 103, at approximately 10 nm from the interface. In FIG. 16, it is shown that the hot holes injections occur in the drain side, involving both the gate/drain overlap region and the channel, in proximity of the Si/SiO$_2$ interface. The hot current magnitude ranges from 0 A·cm$^{-2}$ to 7·10$^{-8}$ A·cm$^{-2}$, black corresponding to the lowest value and white to the highest. The greyscale corresponds furthermore to a linear scale over this range. FIG. 18 to FIG. 20 show simulations of the impact ionization current, for different $V_G=V_S=V_B=0V$ stress conditions, corresponding to $V_D$=1V, $V_D$=2V and $V_D$=3V respectively. The drain region is clearly more affected. Even though this effect is more pronounced for $V_{D,stress}$=3V, the current crowd can already be clearly seen at lower bias. FIG. 18 shows the impact ionization in a range from 1 cm$^{-3}$·s$^{-1}$ to 10$^{25}$ cm$^{-3}$·s$^{-1}$, FIG. 19 shows the impact ionization in a range from 1 cm$^{-3}$·s$^{-1}$ to 10$^{24}$ cm$^{-3}$·s$^{-1}$ and FIG. 20 shows the impact ionization in a range from 1 cm$^{-3}$·s$^{-1}$ to 10$^{25}$ cm$^{-3}$·s$^{-1}$. In these figures, black corresponds to the lowest value and white to the highest value. The greyscale also corresponds to a logarithmic scale in each of these figures.

In this example, the impact of OFF-State Stress on nMOSFET with HKMG has been investigated and compared to its impact on a standard poly-SiO$_2$/SiON device. The degradation is causing $V_{th}$ reduction, $g_m$ and SS worsening which are enhanced by higher temperature. The negative $V_{th}$ shift observed in HKMG poses challenges in terms of circuit leakage impact. The origin of the additional degradation may be linked to hot holes injection into the bulk of the high-κ material, which degrades the electrostatic control of the device in addition to the interface trap degradation.

Therefore the detrimental impact on the device OFF-state gate leakage may be extremely important, causing a serious issue for high voltage and low power oriented circuits. Such problems may be at least partially overcome by embodiments according to the present disclosure.

The invention claimed is:

1. A method for at least partially compensating for a change in threshold voltage level of a field-effect transistor induced by OFF-state stress degradation, the method comprising:
   determining a signal indicative of a change in threshold voltage level of the field-effect transistor with respect to a reference threshold voltage level; and
   applying a restoration signal to the field-effect transistor, wherein applying the restoration signal comprises applying at least one voltage pulse to the field-effect transistor such that a gate terminal of the field-effect transistor is connected to a higher voltage level than a drain terminal of the field-effect transistor and to a higher voltage level than a source terminal of the field-effect transistor, wherein the restoration signal is adapted for shifting the threshold voltage level of the field-effect transistor in a direction having an opposite sign with respect to the change in threshold voltage level, and wherein applying the restoration signal includes taking into account the signal indicative of the change in threshold voltage level.

2. The method according to claim 1, wherein determining the signal indicative of the change in threshold voltage level comprises determining a Boolean indicator value for indicating whether the threshold voltage has shifted in the negative direction by at least a predetermined amount with respect to the reference threshold voltage level.

3. The method according to claim 2, wherein applying the restoration signal includes taking into account the signal indicative of the change in threshold voltage level by applying the restoration signal if the Boolean indicator value is equal to true.

4. The method according to claim 1, wherein determining the signal indicative of the change in threshold voltage level and applying the restoration signal to the field-effect transistor are repeated until the signal indicative of the change in threshold voltage level indicates that the change in threshold voltage level is within a predetermined tolerance.

5. The method according to claim 1, wherein applying the at least one voltage pulse comprises applying the at least one voltage pulse to the field-effect transistor such that a voltage difference between the gate terminal and the drain terminal is larger than a voltage difference between the gate terminal and the source terminal.

6. The method according to claim 5, wherein applying the at least one voltage pulse to the field-effect transistor such that a voltage difference between the gate terminal and the drain terminal is larger than a voltage difference between the gate terminal and the source terminal comprises calculating a source bias voltage and a drain bias voltage taking into account the signal indicative of the change in threshold voltage level of the field-effect transistor with respect to the reference threshold voltage level.

7. The method according to claim 1, wherein applying the at least one voltage pulse comprises applying the at least one voltage pulse of a predetermined duration and a predetermined positive voltage level to the gate terminal, while electrically grounding a body of the field-effect transistor, the source terminal, and the drain terminal.

8. The method according to claim 1, further comprising automatically initiating the determining of the signal indicative of the change in threshold voltage level and the applying of the restoration signal when at least a predetermined number of operations were performed by the field-effect transistor since a previous determining of the signal indicative of the change in threshold voltage level.

9. The method according to claim 1, wherein determining the signal indicative of the change in threshold voltage level with respect to the reference threshold voltage level comprises determining the threshold voltage level as the threshold voltage level of a reference field-effect transistor.

10. An integrated circuit component for at least partially compensating for a change in threshold voltage level of a field-effect transistor induced by OFF-state stress degradation, the integrated circuit component comprising:
a detection circuit configured to determine a signal indicative of a change in threshold voltage level of the field-effect transistor with respect to a reference threshold voltage level; and
a signal generating circuit configured to apply a restoration signal to the field-effect transistor, wherein the signal generating circuit is configured to supply means is adapted for supplying a restoration signal to the field-effect transistor such that the threshold voltage level of the field-effect transistor is shifted in a direction having opposite sign with respect to the change in threshold voltage level, wherein the signal generating circuit is configured to apply the restoration signal by applying at least one voltage pulse to the field-effect transistor such that a gate terminal of the field-effect transistor is connected to a higher voltage level than a drain terminal of the field-effect transistor and to a higher voltage level than a source terminal of the field-effect transistor, and wherein the signal generating circuit is configured to apply the restoration signal by taking into account the signal indicative of the change in threshold voltage level.

11. An integrated semiconductor device comprising:
at least one field-effect transistor; and
an integrated circuit component according to claim 10 for at least partially compensating for a change in threshold voltage level of the at least one field-effect transistor induced by OFF-state stress degradation.

12. The integrated semiconductor device according to claim 11, wherein the at least one field-effect transistor comprises an n-channel and/or p-channel metal-oxide semiconductor field-effect transistor.

13. The integrated semiconductor device according to claim 12, wherein the field-effect transistor comprises a high-κ gate dielectric and a metal gate.

14. The integrated semiconductor device according to claim 13, wherein the at least one field-effect transistor comprises a gate stack having an equivalent oxide thickness of 2.0 nm or less.

15. A method for at least partially compensating for a change in threshold voltage level of a field-effect transistor induced by OFF-state stress degradation, the method comprising:
determining a signal indicative of a change in threshold voltage level of the field-effect transistor with respect to a reference threshold voltage level;
applying a restoration signal to the field-effect transistor, wherein the restoration signal is adapted for shifting the threshold voltage level of the field-effect transistor in a direction having an opposite sign with respect to the change in threshold voltage level, and wherein applying the restoration signal includes taking into account the signal indicative of the change in threshold voltage level; and
automatically initiating the determining of the signal indicative of the change in threshold voltage level and the applying of the restoration signal when at least a predetermined number of operations were performed by the field-effect transistor since a previous determining of the signal indicative of the change in threshold voltage level.

* * * * *